(12) United States Patent
Hosoya et al.

(10) Patent No.: US 8,441,021 B2
(45) Date of Patent: May 14, 2013

(54) DISPLAY DEVICE AND MANUFACTURING METHOD THEREOF

(75) Inventors: Kunio Hosoya, Atsugi (JP); Saishi Fujikawa, Atsugi (JP); Takahiro Kasahara, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/567,215

(22) Filed: Aug. 6, 2012

(65) Prior Publication Data

US 2012/0299027 A1    Nov. 29, 2012

Related U.S. Application Data

(62) Division of application No. 12/408,875, filed on Mar. 23, 2009, now Pat. No. 8,278,713.

(30) Foreign Application Priority Data

Mar. 28, 2008   (JP) ................................ 2008-085409

(51) Int. Cl.
*H01L 29/18* (2006.01)
*H01L 33/00* (2010.01)

(52) U.S. Cl.
USPC .................. 257/88; 257/59; 257/79; 257/350; 257/E33.062

(58) Field of Classification Search . 349/43; 257/51–52, 257/59, 72, 88, 350, E33.062
See application file for complete search history.

(56) References Cited

U.S. PATENT DOCUMENTS

| | | | |
|---|---|---|---|
| 5,376,561 | A | 12/1994 | Vu et al. |
| 6,372,609 | B1 | 4/2002 | Aga et al. |
| 6,583,029 | B2 | 6/2003 | Abe et al. |
| 6,646,692 | B2 | 11/2003 | Yamazaki et al. |
| 6,818,529 | B2 | 11/2004 | Bachrach et al. |
| 6,987,552 | B2 | 1/2006 | Yamazaki et al. |
| 7,119,365 | B2 | 10/2006 | Takafuji et al. |
| 7,145,623 | B2 | 12/2006 | Sasaki |
| 7,199,397 | B2 | 4/2007 | Huang et al. |
| 7,338,844 | B2 | 3/2008 | Ozawa et al. |
| 7,567,328 | B2 | 7/2009 | Yamazaki et al. |

(Continued)

FOREIGN PATENT DOCUMENTS

| | | |
|---|---|---|
| JP | 04-102830 A | 4/1992 |
| JP | 06-018926 A | 1/1994 |

(Continued)

*Primary Examiner* — Leonard Chang
(74) *Attorney, Agent, or Firm* — Eric J. Robinson; Robinson Intellectual Property Law Office, P.C.

(57) ABSTRACT

To achieve enlargement and high definition of a display portion, a single crystal semiconductor film is used as a transistor in a pixel, and the following steps are included: bonding a plurality of single crystal semiconductor substrates to a base substrate; separating part of the plurality of single crystal semiconductor substrates to form a plurality of regions each comprising a single crystal semiconductor film over the base substrate; forming a plurality of transistors each comprising the single crystal semiconductor film as a channel formation region; and forming a plurality of pixel electrodes over the region provided with the single crystal semiconductor film and a region not provided with the single crystal semiconductor film. Some of the transistors electrically connecting to the pixel electrodes formed over the region not provided with the single crystal semiconductor film are formed in the region provided with the single crystal semiconductor film.

20 Claims, 14 Drawing Sheets

U.S. PATENT DOCUMENTS

| | | |
|---|---|---|
| 7,585,703 B2 | 9/2009 | Matsumura et al. |
| 7,601,943 B2 | 10/2009 | Ozawa et al. |
| 2003/0147019 A1 | 8/2003 | Sasaki |
| 2008/0283848 A1 | 11/2008 | Yamazaki |

FOREIGN PATENT DOCUMENTS

| | | |
|---|---|---|
| JP | 10-135479 | 5/1998 |
| JP | 10-177187 A | 6/1998 |
| JP | 11-163363 | 6/1999 |
| JP | 2001-281703 A | 10/2001 |
| JP | 2001-345435 | 12/2001 |
| JP | 2003-005212 A | 1/2003 |
| JP | 2003-029667 | 1/2003 |
| JP | 2003-228301 | 8/2003 |
| JP | 2003-324188 | 11/2003 |
| JP | 2004-184978 A | 7/2004 |
| JP | 2005-122924 A | 5/2005 |
| JP | 2005-539259 | 12/2005 |

DISPLAY DEVICE AND MANUFACTURING METHOD THEREOF

BACKGROUND OF THE INVENTION

1. Field of the Invention

The present invention relates to a display device and a manufacturing method thereof. In particular, the present invention relates to a display device in which a single crystal semiconductor film is used and a manufacturing method the display device.

2. Description of the Related Art

In recent years, integrated circuits using an SOI (silicon on insulator) substrate in which a thin single crystal semiconductor film is formed on its insulating surface, instead of a bulk silicon wafer, have been developed. Since parasitic capacitance between a drain of a transistor and a substrate is reduced by using the SOI substrate, the SOI substrate has attracted attention as one improving performance of semiconductor integrated circuits.

One of known methods for manufacturing an SOI substrates is a Smart Cut (registered trademark) method. An outline of the method for manufacturing an SOI substrate by a Smart Cut method is described below. First, hydrogen ions are implanted into a silicon wafer by an ion implantation method and an ion implantation layer is formed at a predetermined depth from a surface. Next, the silicon wafer into which the hydrogen ions are implanted is bonded to another silicon wafer with a silicon oxide film interposed therebetween. Then, heat treatment is performed and the ion implantation layer becomes a cleavage plane and the silicon wafer into which hydrogen ions are implanted is separated into a thin film, so that a single crystal silicon film can be formed over the silicon wafer which is to be a base substrate.

A method in which a single crystal silicon film is formed over a supporting substrate formed from glass by such a Smart Cut method has been proposed (for example, see Reference 1: Japanese Published Patent Application No. H11-163363). Since glass substrates can have a larger area and are less expensive than silicon wafers, the glass substrates are mainly used for manufacturing liquid crystal display devices and the like.

However, in general, the size of a silicon ingot or a silicon wafer which is to be a base material is small compared to the size of a glass substrate which can be formed. Therefore, when a display device is manufactured using a single crystal semiconductor film formed over a glass substrate using a Smart Cut (registered trademark) method, it is difficult to enlarge a display portion.

Accordingly, when a display device provided with a large display portion is manufactured using a single crystal semiconductor film, a plurality of silicon wafers is required to be bonded to a glass substrate having a large area. For example, a technique for making small pieces of single crystal silicon into a tiled pattern over a glass substrate is disclosed as for an SOI substrate for an active matrix liquid crystal display in Reference 2: Japanese Published Patent Application No. 2005-539259.

In order to improve a resolution of a display region in a display device while keeping the same display area, the size of a pixel is required to be reduced. When the size of the pixel is reduced, an interval between thin film transistors (TFTs) each provided in a pixel is reduced logically. However, since silicon does not exist in a gap (a joint portion) of a plurality of single crystal silicon provided over a glass substrate by bonding, a thin film transistor cannot be manufactured at the joint portion. Therefore, improvement in the resolution (higher definition) of the display portion is difficult.

Further, an edge portion of a semiconductor substrate is rounded generally, and a bonding at the edge portion cannot be performed sufficiently (for example, see Reference 3: Japanese Published Patent Application No. 2001-345435). Accordingly, even when a plurality of semiconductor substrates is arranged so as to be adjacent to each other, it is very hard to eliminate the joint portion between the semiconductor substrates completely.

SUMMARY OF THE INVENTION

One object of the present invention is to achieve enlargement and high definition of a display portion even when a single crystal semiconductor film is used as an element included in a pixel. Another object of the present invention is to reduce display defects due to delay of signals in addition to achievement of enlargement and high definition of the display portion even when the single crystal semiconductor film is used as the element included in the pixel.

One embodiment of the present invention is to form switching elements corresponding to a plurality of pixels using a single crystal semiconductor film in a display portion provided with the plurality of pixels, and to form the single crystal semiconductor film included in the switching element corresponding to part of the pixels, in a pixel region of a different pixel.

Note that, in this specification, "a pixel" is the minimum unit forming an image. In a display, a pixel including pixels for "R", "G", and "B" (or "R", "G", "B", and "W") is referred to as one pixel in some cases; however, in this specification pixels including "R", "G", and "B" (or "R", "G", "B", and "W") each are referred to as one pixel.

Further, in this specification, "a pixel region" refers to a region occupied by one pixel. Specifically, when a pixel electrode is provided in each of pixels, a region where the pixel electrode is formed (a pixel electrode formation region) and the periphery of the pixel electrode formation region refer to the pixel region. For example, when the pixel electrodes are arranged in matrix, the pixel region refers to a region divided for convenience according to the position of the pixel electrode. Further, when the pixel electrode is not provided in each of the pixel as an IPS (in-plane-switching) method, the pixel region refers to a region divided, for convenience, per unit cell forming an image.

Further, another embodiment of the present invention is that, in the aforementioned structure, each of the plurality of pixels includes the pixel electrode and the single crystal semiconductor film included in the switching element corresponding to the part of the pixels and the single crystal semiconductor film included in the switching element corresponding to the different pixel are provided below or in the periphery of the pixel electrode of the different pixel.

Here, the state where a first single crystal semiconductor film included in a switching element corresponding to one pixel (a first pixel) and a second single crystal semiconductor film included in a switching element corresponding to a different pixel (a second pixel) are provided in the periphery of a second pixel electrode corresponding to the second pixel refers to the state where the first single crystal semiconductor film and the second single crystal semiconductor film are provided closer to the second electrode than a first electrode corresponding to the first pixel.

Further, another embodiment of the present invention is to form the single crystal semiconductor film included in the switching element corresponding to the part of the pixels and the single crystal semiconductor film included in the switching element corresponding to the different pixel are provided collectively in the aforementioned structure,.

Further, another embodiment of the present invention is that, in the aforementioned structure, the switching element corresponding to the part of the pixels and the pixel electrode provided in the part of the pixels are electrically connected to each other via a first wiring, the switching element corresponding to the different pixel and the pixel electrode provided in the different pixel are electrically connected to each other via a second wiring, the first wiring is longer than the second wiring, and a resistance value of the first wiring is smaller than a resistance value of the second wiring. Note that "the resistance value of the wiring" refers to a resistance value per unit length of the wiring. Accordingly, in the present invention, the resistance value of the first wiring which is relatively longer is set to be smaller than the resistance value of the second wiring.

Further, another embodiment of the present is that the part of the pixels is provided along the row direction and/or the column direction of the display portion in the aforementioned structure.

Further, another embodiment of the present invention is that the switching element is a transistor in which a channel formation region is formed from the single crystal semiconductor film in the aforementioned structure.

Further, another embodiment of the present invention is to include the following steps: a base substrate and a plurality of single crystal semiconductor substrates are prepared; the plurality of single crystal semiconductor substrates is bonded to a surface of a base substrate; part of the plurality of single crystal semiconductor substrates is separated to form a plurality of regions provided with a single crystal semiconductor film which are formed of the single crystal semiconductor film, over the base substrate; a transistor in which the single crystal semiconductor film is used as a channel formation region is formed in the region provided with a single crystal semiconductor film; and a pixel electrode is formed in each of the region provided with a single crystal semiconductor film and a region not provided with a single crystal semiconductor film, and to form the transistor electrically connecting to the pixel electrode provided in the region not provided with a single crystal semiconductor film using the single crystal semiconductor film formed in the region provided with a single crystal semiconductor film. Note that the region not provided with a single crystal semiconductor film refers to a region located between the plurality of regions provided with a single crystal semiconductor film, and is not provided with the single crystal semiconductor film.

Further, another embodiment of the present invention is to include the following steps: a base substrate and a plurality of single crystal semiconductor substrates are prepared; the plurality of single crystal semiconductor substrates is bonded to a surface of the base substrate; part of the plurality of the single crystal semiconductor substrates is separated to form a plurality of regions provided with a single crystal semiconductor film, which are formed from the single crystal semiconductor film, over the base substrate; a plurality of transistors including a first transistor and a second transistor, in which the single crystal semiconductor film is used as a channel formation region is formed in the region provided with a single crystal semiconductor film; a first pixel electrode in a region not provided with a single crystal semiconductor film and a second pixel electrode in the region provided with a single crystal semiconductor film, are formed; and a first wiring which connects the first transistor and the first pixel electrode electrically and a second wiring which connects the second transistor and the second pixel electrode electrically are formed. Then, by forming the first wiring so as to be longer than the second wiring, a resistance value of the first wiring is set to be smaller than a resistance value of the second wiring.

"Single crystal" in this specification refers to a crystal in which crystal planes and crystal axes are aligned and atoms or molecules which are included in the single crystal are aligned in a spatially ordered manner. Although the single crystal is structured by orderly aligned atoms, the single crystal may include a lattice defect in which the alignment is disordered as a part or the single crystal may include lattice strain intentionally or unintentionally.

In addition, in this specification, a display device includes a light-emitting device and a liquid crystal display device in its category. The light-emitting device includes a light-emitting element, and the liquid crystal display device includes a liquid crystal element. The light-emitting element refers to an element whose luminance is controlled by current or voltage in its category. Specifically, the light-emitting element includes an inorganic EL (electroluminescence) element, an organic EL element, and the like in its category.

According to the present invention, even when a single crystal semiconductor film is used as an element included in a pixel, enlargement and high definition of a display portion can be achieved. Further, when a switching element corresponding to part of pixels is provided in another pixel region, by reducing a resistance value of a wiring which electrically connects the switching element corresponding to the part of the pixels and the pixel electrode compared with other wirings, display defects due to delay of signals can be reduced while realizing enlargement and high definition of the display portion.

DETAILED DESCRIPTION OF THE INVENTION

Embodiments of the invention will be described below with reference to the drawings. However, the present invention can be implemented in various different modes, and it is to be easily understood that various changes and modifications in modes and details thereof will be apparent to those skilled in the art without departing from the meaning and the scope of the present invention. Therefore, the present invention is not to be construed with limitation to what is described in the Embodiments.

Through the drawings of the embodiments, like components are denoted by like numerals and will not be further explained.

[Embodiment 1]

In this embodiment, a manufacturing method of a display device and a structure of the display device will be described with reference to the drawings. Specifically, the case will be described, in which a plurality of single crystal semiconductor substrates is bonded to a surface of a base substrate, respective parts of each of the plurality of single crystal semiconductor substrates is separated to form single crystal semiconductor films over the base substrate, and then the display portion of the display device is formed using the single crystal semiconductor films formed over the base substrate.

[Process for Manufacturing SOI Substrate]

First, one example of a process for forming the plurality of single crystal semiconductor films over the base substrate will be described with reference to FIGS. 1A to 1F and FIGS. 2A and 2B. In this embodiment, an example is described, in which after a plurality of single crystal semiconductor substrates 101a to 101d is bonded to a surface of a base substrate 120, respective parts of each of the single crystal semiconductor substrates 101a to 101d are separated, whereby the plurality of single crystal semiconductor films is formed over the base substrate 120 (see FIGS. 2A and 2B).

Figure 1A:
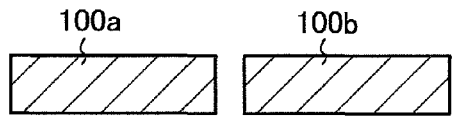
FIGS. 1A to 1F illustrate an example of a method for manufacturing a display device according to the present invention.

First, a plurality of single crystal semiconductor substrates is prepared (see FIG. 1A). Here, the case of using the single crystal semiconductor substrates 100a to 100d will be described. Note that FIGS. 1D to 1F correspond to a cross sectional view taken along line A-B in FIGS. 2A and 2B. Further, although description is made using the single crystal semiconductor substrates 100a and 100b with reference to FIG. 1A to 1F, the same process can be performed on the single crystal semiconductor substrates 100c and 100d.

A commercial single crystal semiconductor substrate can be used for each of the single crystal semiconductor substrates 100a to 100d. For example, a single crystal silicon substrate, a single crystal germanium substrate, and a compound semiconductor substrate of gallium arsenide, indium phosphide, or the like can be used. Typically, the size of a commercial silicon substrate is five inches (125 mm) in diameter, six inches (150 mm) in diameter, eight inches (200 mm) in diameter, or 12 inches (300 mm) in diameter, and a shape thereof is a circular shape. Note that the silicon substrate is not limited to a silicon substrate having a circular shape, and a silicon substrate processed to have a rectangular shape or the like can also be used. With use of the silicon substrate processed to have a rectangular shape or the like, when the plurality of silicon substrates is arranged, an interval between the silicon substrates can be reduced. Hereinafter, the case where the single crystal silicon substrates processed to have a rectangular shape are used as the single crystal semiconductor substrates 100a to 100d will be described.

Figure 1C:
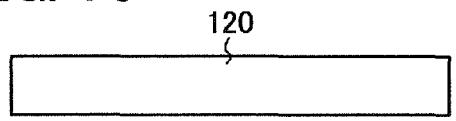
Figure 1B:
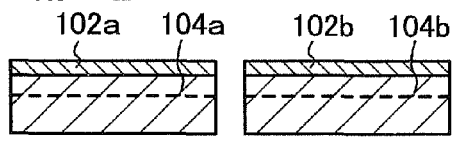

Next, an insulating film 102a is formed on a surface of the single crystal semiconductor substrate 100a and an embrittlement region 104a is formed at a predetermined depth from the surface of the single crystal semiconductor substrate 100a (see FIG. 1B). The same applies to the single crystal semiconductor substrate 100b. An insulating film 102b is formed over a surface of the single crystal silicon substrate 100b and an embrittlement region 104b is formed at a predetermined depth from the surface of the single crystal silicon substrate 100b.

As each of the insulating films 102a and 102b, a single layer of a silicon oxide film, a silicon oxynitride film, a silicon nitride film, a silicon nitride oxide film, or the like, or a stacked layer thereof can be used, for example. Such an insulating film can be formed by a CVD method, a sputtering method, or the like. In addition, when the insulating films 102a and 102b are formed by a CVD method, silicon oxide films formed by using organosilane such as tetraethoxysilane (abbreviation: TEOS, chemical formula: $Si(OC_2H_5)_4$) are used as the insulating films 102a and 102b.

For example, a silicon oxynitride film and a silicon nitride oxide film are stacked sequentially over each of the single crystal semiconductor substrates 100a and 100b. Then, ions are added to the regions at a predetermined depth from the surfaces of the single crystal semiconductor substrates 100a and 100b, and then the silicon oxide film formed using tetraethoxysilane by a CVD method may be formed over the silicon nitride oxide film.

Note that a silicon oxynitride film refers to a film that contains more oxygen than nitrogen and, in the case where measurements are performed using Rutherford backscattering spectrometry (RBS) and hydrogen forward scattering (RFS), includes oxygen, nitrogen, silicon, and hydrogen at concentrations ranging from 50 at.% to 70 at. %, 0.5 at. % to 15 at. %, 25 at. % to 35 at. %, and 0.1 at. % to 10 at.%, respectively. Further, a silicon nitride oxide film refers to a film which contains more nitrogen than oxygen and includes oxygen, nitrogen, silicon, and hydrogen at concentrations ranging from 5 to 30 at. %, 20 to 50 at. %, 25 to 35 at. %, and 15 to 25 at. %, respectively, in the case where measurement is performed using RBS and HFS. Note that percentages of nitrogen, oxygen, silicon, and hydrogen fall within the ranges given above, where the total number of atoms contained in the silicon oxynitride film or the silicon nitride oxide film is defined as 100 atomic %.

Alternatively, the insulating films 102a and 102b may be formed be performing thermal oxidation treatment on the single crystal semiconductor substrates 100a and 100b. In this case, the thermal oxidation treatment is preferably performed in an oxidation atmosphere to which halogen is added. As one example of such thermal oxidation treatment, thermal oxidation can be performed in an atmosphere containing hydrogen chloride (HCl) at 0.5 vol % to 10 vol % (preferably 3 vol %) with respect to oxygen, at a temperature of 900° C. to 1150° C. (typically, 1000° C.). Processing time may be 0.1 hour to 6 hours, preferably 0.5 hour to 1 hour. The thickness of the oxide film to be formed is 10 nm to 1000 nm (preferably, 50 nm to 200 nm), and for example, a thickness of 100 nm is employed.

Heat treatment is performed in an oxidation atmosphere to which halogen is added so that the insulating films 102a and 102b contain halogen (for example, chlorine atoms), whereby effect of capturing a heavy metal that is an extrinsic impurity and preventing the semiconductor substrate from being contaminated is obtained. Further, with heat treatment performed after formation of the insulating films 102a and 102b, a metal contained as an impurity in the single crystal semiconductor substrates 100a and 100b is deposited to the insulating films 102a and 102b and captured by reaction with chlorine. As a result, contamination of the single crystal semiconductor substrates 100a and 100b can be prevented.

The embrittlement regions 104a and 104b can be formed by irradiating the single crystal semiconductor substrates 100a and 100b with ions having kinetic energy. Here, the single crystal semiconductor substrates 100a and 100b are irradiated with ions through the insulating films 102a and 102b and a crystal structure at a predetermined depth of the single crystal semiconductor substrates 100a and 100b is damaged, whereby the embrittlement regions 104a and 104b are formed. The ions are ions which are obtained in such a manner that a source gas is excited to produce plasma of the source gas, and that ions included in the plasma are extracted from the plasma by the action of electric field and accelerated.

The depth of the regions where the embrittlement regions 104a and 104b are formed can be controlled depending on the kinetic energy, the mass, and the incident angle of ions. The kinetic energy can be controlled by an acceleration voltage, dosage, or the like. The embrittlement regions 104a and 104b are formed at the same depth or substantially the same depth as the average depth at which the ions have entered. Therefore, the thickness of semiconductor layers separated from the single crystal semiconductor substrates 100a and 100b can be determined by the depth at which the ions are added. The depth at which the embrittlement regions 104a and 104b are formed is controlled so that the thickness of these semiconductor layers is greater than or equal to 10 nm and less than or equal to 500 nm, preferably greater than or equal to 50 nm and less than or equal to 200 nm.

The embrittlement regions 104a and 104b can be formed by ion doping treatment. The ion doping treatment can be performed using an ion doping apparatus. An ion doping apparatus is typically a non-mass-separation type apparatus for irradiating an object to be processed which is disposed in a chamber with all kinds of ions which are generated by plasma excitation of a process gas. The apparatus is called "non-mass-separation type apparatus" because an object to be processed is irradiated with all kinds of ions without mass-separating ions in plasma. In contrast, an ion implantation apparatus is a mass-separation apparatus. The ion implantation apparatus is an apparatus with which an object is irradiated with ion species having a specific mass through mass separation of ion species in plasma.

In this embodiment, hydrogen is added to the single crystal semiconductor substrates 100a and 100b using an ion doping apparatus. A gas containing hydrogen is supplied as a plasma source gas. For example, $H_2$ is supplied. Plasma is generated by excitation of a hydrogen gas. Ions included in plasma are accelerated without mass separation and the single crystal semiconductor substrates 100a and 100b are irradiated with the accelerated ions.

In the ion doping apparatus, the percentage of $H_3^+$ to the total quantity of ion species ($H^+$, $H_2^+$, and $H_3^+$) generated from a hydrogen gas is set to be greater than or equal to 50%. Preferably, the percentage of $H_3^+$ is set to be 80% or more. Since mass separation is not performed in an ion doping apparatus, the percentage of one kind to plural kinds of ion species generated in plasma is preferably set to be higher than or equal to 50%, more preferably higher than or equal to 80%. By irradiation with ions having the same mass, ions can be added in a concentrated manner to the same depth in the single crystal semiconductor substrates 100a and 100b.

In order to form the embrittlement regions 104a and 104b in a shallow region, the acceleration voltage for the ions is required to be low. By an increase in the percentage of $H_3^+$ ions in plasma, atomic hydrogen (H) can be added to the single crystal semiconductor substrates 100a and 100b efficiently. Because the mass of an $H_3^+$ ion is three times as large as that of an $H^+$ ion, when one hydrogen atom is added to the same depth, the acceleration voltage for an $H_3^+$ ion can be three times as high as that of an $H^+$ ion. When the acceleration voltage for ions can be increased and the cycle time of an ion irradiation step can be shortened, so that productivity and throughput can be improved.

A step of irradiating the single crystal semiconductor substrates 100a and 100b with the accelerated ions can also be performed with an ion implantation apparatus. The ion implantation apparatus is a mass-separation apparatus with which an object that is disposed in a chamber is irradiated with a specific ion species through mass separation of a plurality of ion species that are generated by plasma excitation of a source gas. Thus, when an ion implantation apparatus is used, $H^+$ ions and $H_2^+$ ions that are generated by excitation of a hydrogen gas are subjected to mass separation, and either $H^+$ ions or $H_2^+$ ions are accelerated, with which the single crystal semiconductor substrates 100a and 100b are irradiated.

Next, the base substrate 120 is prepared (see FIG. 1C).

As the base substrate 120, a substrate formed of an insulator is used. Specifically, a glass substrate used in the electronics industry such as an aluminosilicate glass substrate, an aluminoborosilicate glass substrate, or a barium borosilicate glass substrate can be used as the base substrate 120. With use of a glass substrate or a plastic substrate which can have a large area and is inexpensive as the base substrate 120, a cost can be reduced more than in the case of using a silicon wafer. Furthermore, a plastic substrate having heat resistance which can withstand process temperature in a manufacturing process may also be used.

Figure 1D:
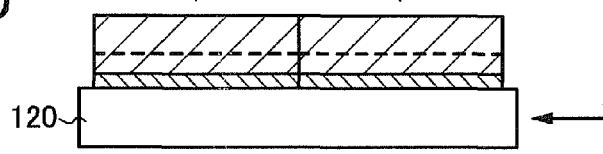
Figure 2A:
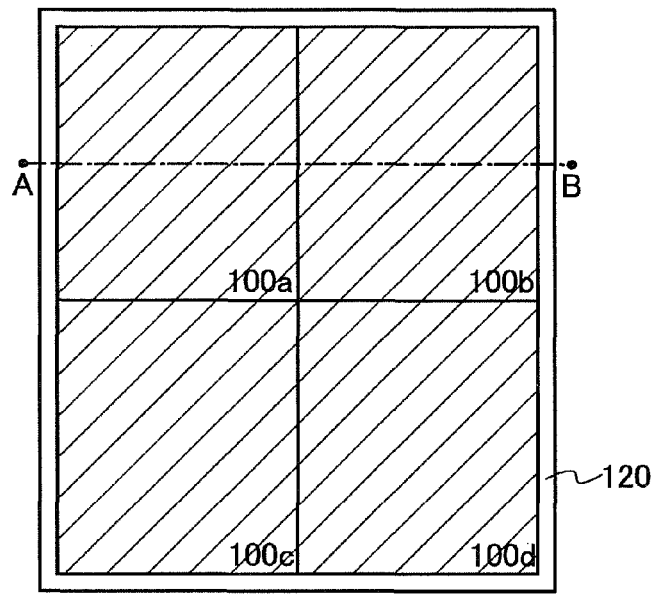
FIGS. 2A and 2B illustrate an example of a method for manufacturing a display device according to the present invention.

Next, with use of the method illustrated in FIGS. 1A to 1C, each of surfaces of the single crystal semiconductor substrates 100a and 100b and a surface of the base substrate 120 are disposed to face each other, and each of surfaces of the insulating films 102a and 102b and the surface of the base substrate 120 are bonded to each other (see FIG. 1D and FIG. 2A).

Specifically, each of the surfaces of the insulating films 102a and 102b and the surface of the base substrate 120 are in contact with each other, and then each of corner portions of the semiconductor substrates 100a and 100b are pressed. A bonding between the insulating films 102a and 102b and the base substrate 120 begins at the pressed portion and then the spontaneous bonding proceeds throughout the surface. This bonding step is performed by Van der Waals force or hydrogen bond at the normal temperature without heat treatment. Therefore, a substrate with low heat resistance temperature, such as a glass substrate, can be used as the base substrate 120.

After the single crystal semiconductor substrates 100a and 100b are bonded to the base substrate 120, heat treatment for increasing a bonding strength between the base substrate 120 and the insulating films 102a and 102b is preferably performed. This heat treatment is performed at a temperature at which a crack is not generated in the embrittlement regions 104a and 104b and can be performed at a temperature greater than or equal to a room temperature and less than 400° C. Further, while heating in this range of the temperature, the insulating films 102a and 102b formed over the single crystal semiconductor substrates 100a and 100b are bonded to the base substrate 120, whereby the bonding strength at a bonding interface between the base substrate 120 and the insulating films 102a and 102b can be increased. For the heat treatment, a diffusion furnace, a heating furnace such as a resistance heating furnace, a rapid thermal anneal (RTA) apparatus, a microwave heating apparatus, or the like can be used.

Figure 1E:
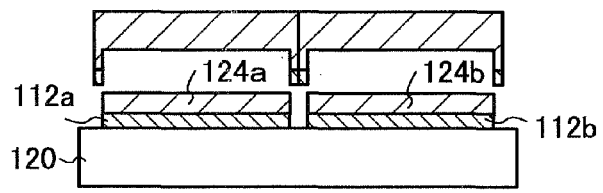

Next, heat treatment is performed and separation is generated in the embrittlement regions 104a and 104b, so that single crystal semiconductor films 124a and 124b are formed over the base substrate 120 with insulating films 112a and 112b interposed therebetween (see FIG. 1E).

When the heat treatment is performed, the element added in the ion doping is deposited to microvoids which are formed in the embrittlement regions 104a and 104b by elevation of the temperature, and the internal pressure of the microvoids is increased. By increasing the pressure, the microvoids in the embrittlement regions 104a and 104b are changed in volume and a crack is generated in the embrittlement regions 104a and 104b. Thus, the single crystal semiconductor substrates 100a and 100b are cleaved along the embrittlement regions 104a and 104b. Since the insulating films 112a and 112b are bonded to the base substrate 120, the single crystal semiconductor films 124a and 124b, which have been separated from the single crystal semiconductor substrates 100a and 100b, are formed over the base substrate 120. Further, the temperature in the heat treatment is set so as not to exceed the strain point of the base substrate 120.

For this heat treatment, a diffusion furnace, a heating furnace such as a resistance heating furnace, a rapid thermal annealing (RTA) apparatus, a microwave heating apparatus, or the like can be used. For example, the heat treatment can be performed using an RTA apparatus at a heat temperature of greater than or equal to 550° C. and less than or equal to 700° C., for a process time of greater than or equal to 0.5 minutes and less than or equal to 60 minutes.

Figure 1F:
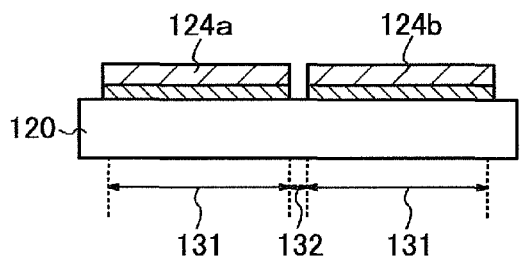
Figure 2B:
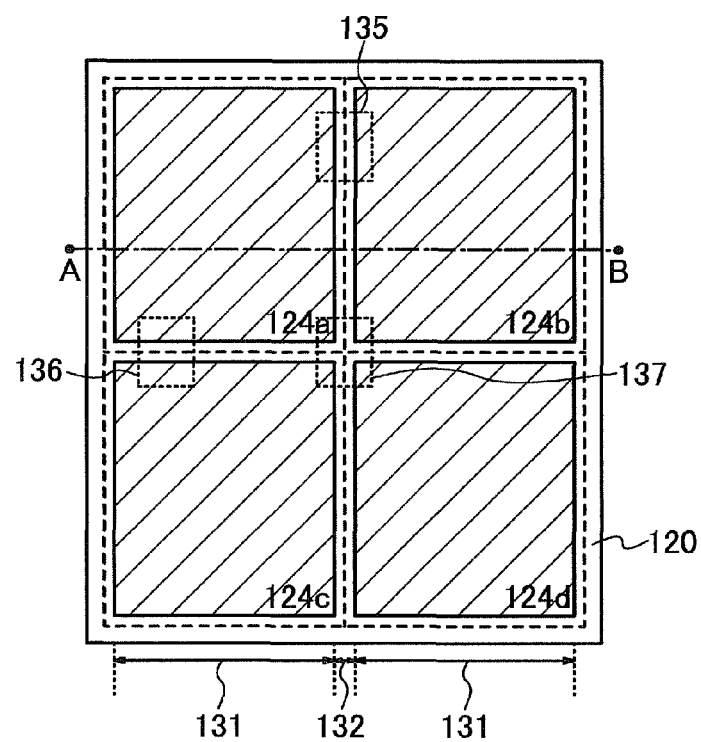

Through the aforementioned process, an SOI substrate in which the plurality of single crystal semiconductor films 124a to 124d is provided over the base substrate 120 with the insulating films interposed therebetween can be manufactured (see FIG. 1F and FIG. 2B).

[Structure of Display Portion of Display Device]

Next, a method for manufacturing the display portion of the display device using the SOI substrate obtained through the aforementioned process will be described with reference to FIG. 3.

The SOI substrate obtained through the aforementioned process includes a region provided with a single crystal semiconductor film (hereinafter, also referred to as a first region 131) in which the single crystal semiconductor films 124a to 124d are formed over the base substrate 120 and a region not provided with a single crystal semiconductor film (hereinafter, also referred to as a second region 132) in which the single crystal semiconductor film is not formed (see FIG. 1F and FIG. 2B). In FIG. 2B, a plurality of the first regions 131 (here, four first regions 131) is formed and the second region 132 is formed so as to be located between the plurality of first regions 131. The second region 132 corresponds to a joint portion of the plurality of single crystal semiconductor substrates.

In this embodiment, pixels are formed in both of the first region 131 and the second region 132. In order to realize this, a switching element corresponding to the pixel provided in the second region 132 is formed in a region of any one of pixels provided in the first region 131. Here, the switching element corresponding to one pixel refers to an element which controls the pixel by applying a predetermined voltage to the one pixel or applying current to the one pixel. Hereinafter, a structure of the display device is described with reference to FIG. 3, FIG. 4, FIG. 5, FIG. 6, FIG. 7, FIG. 8, FIG. 9, FIG. 10, and FIG. 11. Note that, in FIG. 3, FIG. 4, FIG. 5, and FIG. 6, a part surrounded by a dotted line corresponds to one pixel.

Further, in this embodiment, the switching element is acceptable as long as the switching element functions as a switch, and may be formed using a transistor, a diode, or a logic circuit which is a combination of the transistor and the diode. Hereinafter, the case of using a thin film transistor as the switching element will be described.

Figure 3:
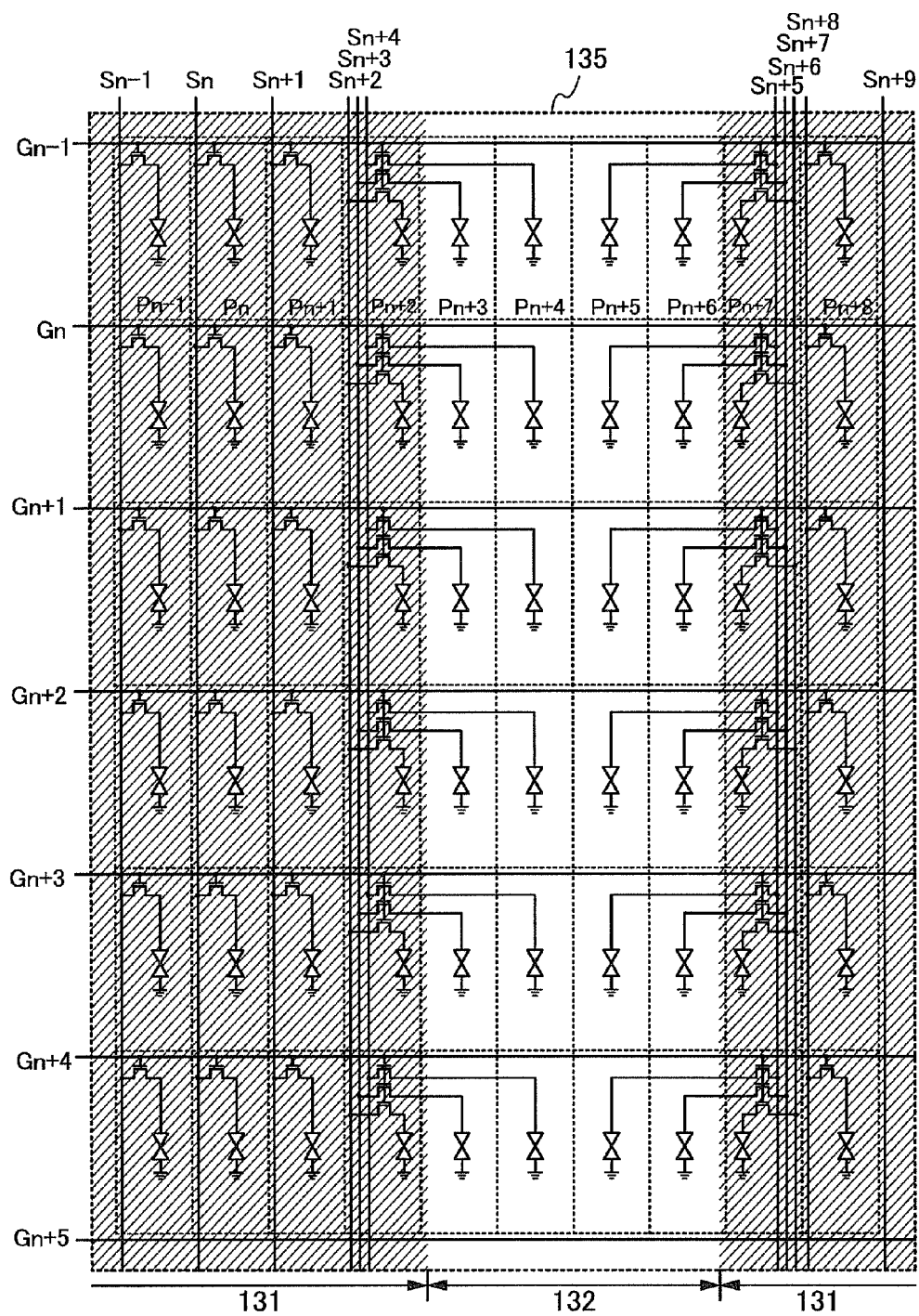
FIG. 3 illustrates an example of a display portion of a display device according to the present invention.

FIG. 3 illustrates one example of a structure in which the second region 132 exists along the perpendicular direction (column direction) in the display portion in which the plurality of pixels are provided in matrix (a region 135 in FIG. 2B).

FIG. 3 illustrates the example in which, in the horizontal direction (row direction), the four pixels are provided in the second region 132 in which the single crystal semiconductor film is not formed. For example, the case in which when the width of the second region 132 is 200 μm in the row direction, a pitch between the pixels is 50 μm in the row direction is assumed.

As for the pixel arranged in the second region 132, since the switching element corresponding to the pixel cannot be formed in a pixel region corresponding to the pixel, the switching element corresponding to the pixel is provided in a pixel region of a different pixel. Here, the case in which, of the plurality of pixels provided in the first region 131, the pixel adjacent to the pixel provided in the second region 132 (in FIG. 3, a pixel supplied with data signals from a signal line of (Sn+2)-th column and a pixel supplied with data signals from a signal line of (Sn+7)-th column (hereinafter, referred to as a pixel of (Sn+2)-th column and a pixel of (Sn+7)-th column, respectively)) are used as the different pixel is described. Of the plurality of pixels provided in the first region 131, the pixel adjacent to the pixel provided in the second region 132 is used, whereby a wiring connecting a pixel electrode of the pixel provided in the second region 132 and the switching element corresponding to the pixel provided in the second region 132 can be shortened.

In this manner, even when the joint portion is generated between the plurality of single crystal semiconductor films provided over the base substrate by a bonding, the switching element corresponding to the pixel provided in the second region 132 is fanned using the single crystal semiconductor film of the first region 131, so that the pixel can be formed over the joint portion. As a result, even in the case of using the single crystal semiconductor film as the element included in the pixel, the size of the pixel can be reduced and high definition can be achieved while the display portion can be enlarged.

In addition, in order to form the switching elements collectively, wirings (here, signal lines Sn+2 to Sn+4 and signal lines Sn+5 to Sn+8) for connecting to the switching elements provided collectively are provided in a collective manner. When the signal lines are formed collectively, a distance between the switching elements provided collectively and the signal lines can be shortened and delay of signals can be reduced. Note that when a space between the wirings provided collectively becomes a problem, a multilayer wiring structure may be employed. With the multilayer wiring structure, an increase in the space between the wirings can be suppressed and an aperture ratio can be improved.

Figure 4:
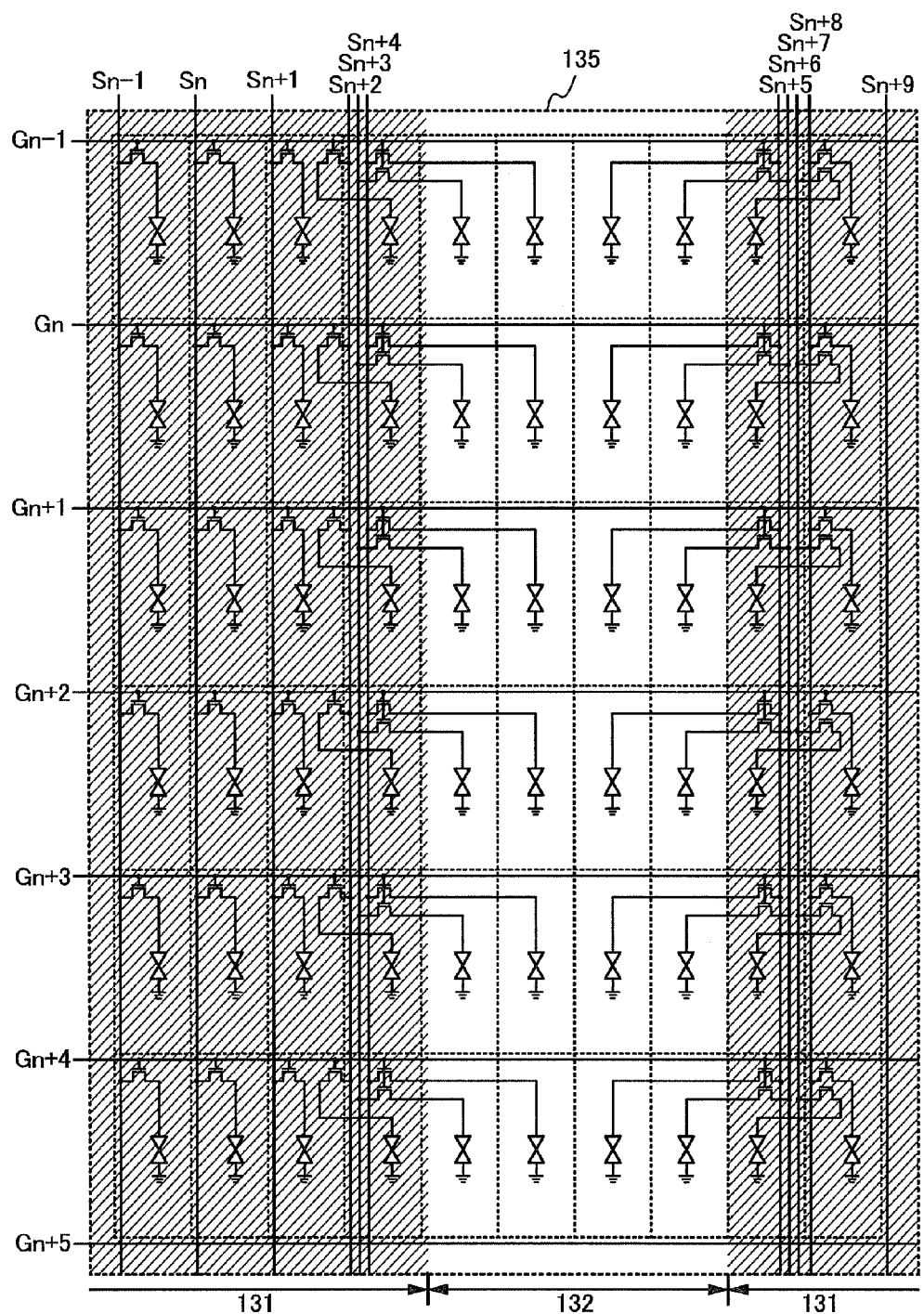
FIG. 4 illustrates an example of a display portion of a display device according to the present invention.

In addition to the structure illustrated in FIG. 3, the switching element of the pixel (the pixel of (Sn+2)-th column and the pixel of (Sn+7)-th column) of the plurality of pixels provided in the first region 131, which is adjacent to the pixel provided in the second region 132, can be formed in a region of a pixel (a pixel of (Sn+1)-th column and a pixel of (Sn+8)- th column) which is adjacent to the pixel (the pixel of (Sn+2)-th column and the pixel of (Sn+7)-th column) provided in the first region 131 (see FIG. 4). With a structure illustrated in FIG. 4, since the switching elements can be formed so as not to be formed densely in the specific pixels (the pixels of (Sn+2)-th column and the pixel of (Sn+7)-th column), reduction in aperture ratio of the specific pixels can be mitigated. Specifically, when a large number of the pixels are formed in the second region 132, the structure illustrated in FIG. 4 is effective. In FIG. 4, when an overlap of wirings becomes a problem, the multilayer wiring structure may be employed.

Figure 5:
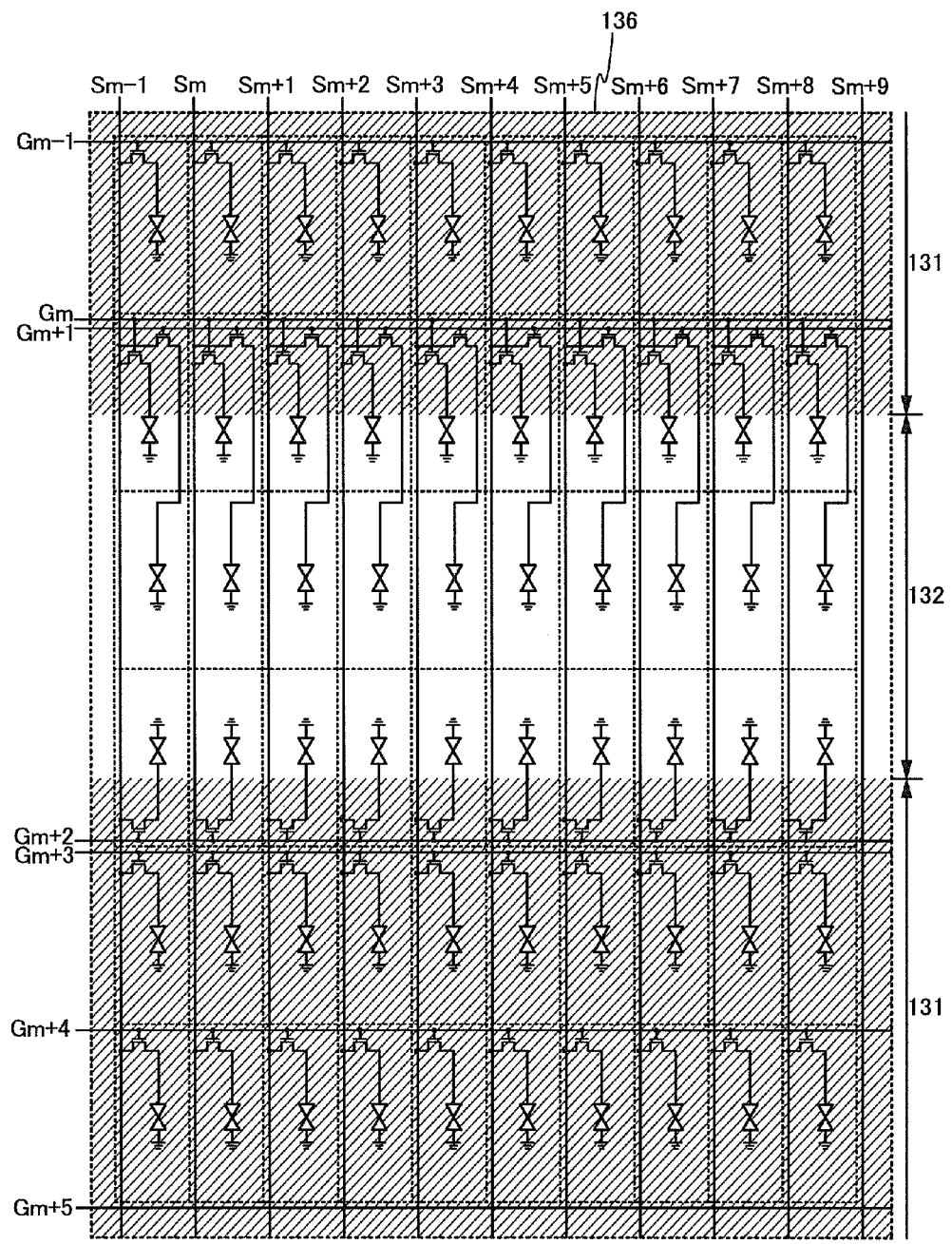
FIG. 5 illustrates an example of a display portion of a display device according to the present invention.

FIG. 5 illustrates one example of a structure in which the second region 132 exists along the row direction (a region 136 in FIG. 2B) in the display portion in which the plurality of pixels is provided in matrix.

The switching element corresponding to the pixel arranged in the second region 132 is formed in a region of a different pixel since the switching element cannot be formed in a pixel region of the pixel corresponding to the switching element. FIG. 5 illustrates the case in which all of the pixels (hereinafter, referred to as pixels of (Gm+1)-th row) whose drive is controlled by a scanning line of (Gm+1)-th row, part of pixels of Gm-th row, part of pixels of (Gm+2)-th row are provided in the second region 132. That is, the pixels of Gm-th row and the pixels of (Gm+2)-th row are arranged in both the first region 131 and the second region 132.

Therefore, a switching element corresponding to the pixel of Gm-th row is formed in a region corresponding to the first region 131 in the pixel region of Gm-th row. Similarly, a switching element corresponding to the pixel of (Gm+2)-th row is formed in a region corresponding to the first region 131 in the pixel region of (Gm+2)-th row. On the other hand, a switching element of the pixel of (Gm+1)-th row is formed in the region corresponding to the first region 131 of a pixel region of a pixel (which is the pixel of Gm-th row, here) which is adjacent to the pixel of (Gm+1)-th row in the column direction.

The switching element of the pixel provided in the second region 132 is formed in a pixel region, which is the closest to the pixel provided in the second region 132, in the first region 131, whereby the wiring which connects the pixel electrode of the pixel formed in the second region 132 and the switching element corresponding to the pixel can be shortened.

Figure 6:
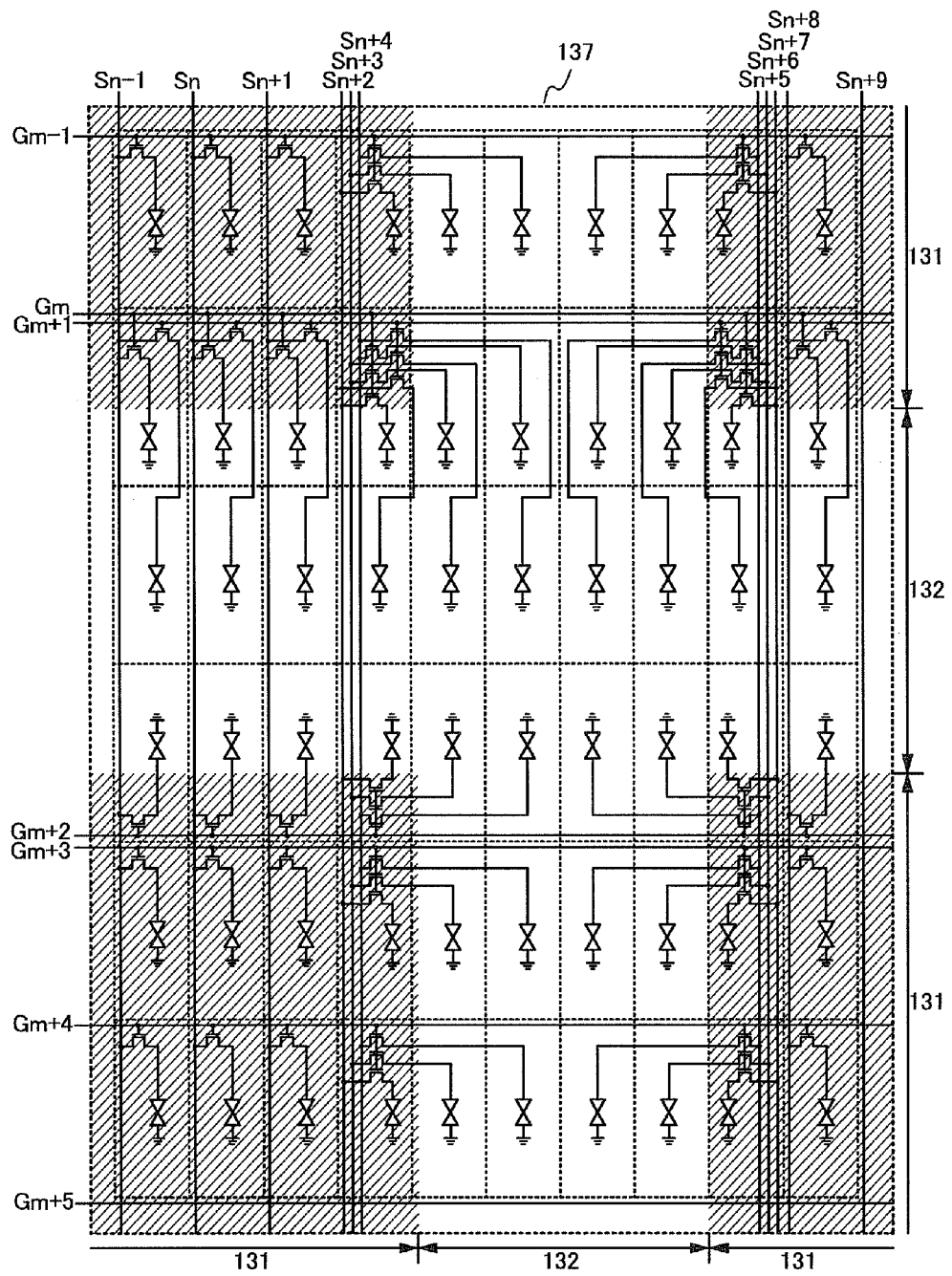
FIG. 6 illustrates an example of a display portion of a display device according to the present invention.

FIG. 6 illustrates one example of a structure in which the second region 132 exists along the row direction and the column direction (a region 137 in FIG. 2B) in the display portion in which the plurality of pixels is arranged in matrix.

As described above, the switching element corresponding to the pixel provided in the second region 132 is formed in a region of a different pixel since the switching element cannot be formed in a pixel region corresponding to the switching element. Specifically, the switching elements corresponding to part where the second region 132 exists in both of the row direction and the column direction are formed collectively in a pixel region of the pixel (which are a pixel to which data signals are supplied by the signal line of (Sn+2)-th column and whose drive is controlled by the scanning line of Gm-row and a pixel to which data signals are supplied by the signal line of (Sn+7)-th column and whose drive is controlled by the scanning line of Gm-th row, here) which is adjacent to the second region 132.

In this manner, even when the joint portion is generated between the plurality of single crystal semiconductor films provided over the base substrate by a bonding, the switching element corresponding to the pixel provided in the second region 132 is formed using the single crystal semiconductor film of the first region 131, so that the pixel can be formed over the junction portion. As a result, even when the single crystal semiconductor film is used for the element included in the pixel, reduction in the size of the pixel and high definition can be achieved while enlargement of the display portion can be realized.

Next, a specific structure of the pixel will be described with reference to FIG. 7, FIG. 8, FIG. 9, FIG. 10, and FIG. 11.

Figure 7:
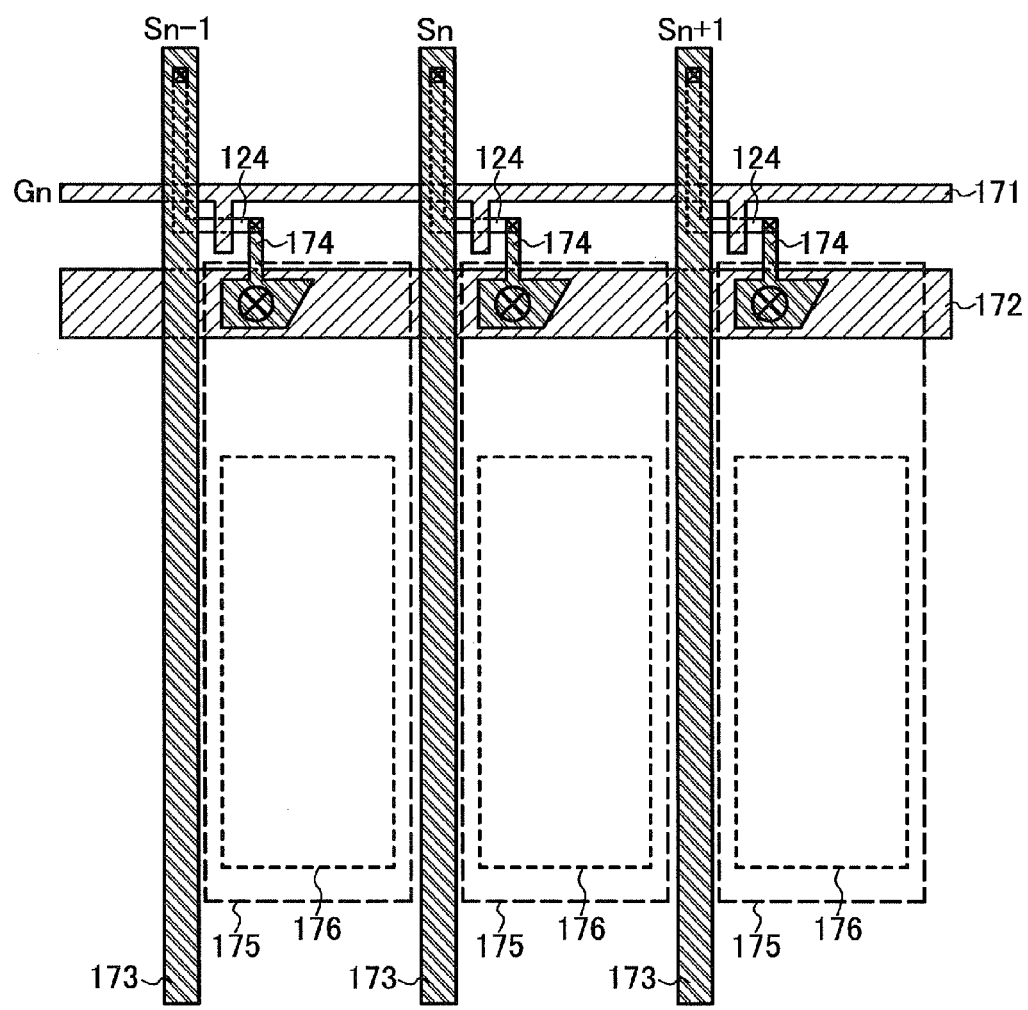
FIG. 7 illustrates an example of a pixel structure of a display device according to the present invention.

FIG. 7 illustrates one structural example of a pixel where only a switching element corresponding to the pixel is formed in a pixel region of the pixel which is formed in the first region 131. For example, the pixel corresponds to the pixels of (Sn−1)-th column to (Sn+1)-th column in FIG. 3. Note that, in this embodiment, although the structure of the pixel in a liquid crystal display device is described as a specific example, the structure of the pixel can be applied to another display device, such as an EL display device.

In the pixels illustrated in FIG. 7, a scanning line 171 (which is the scanning line of Gn-th row, here) and a capacitor line 172 are arranged along the row direction and signal lines 173 (which are signal lines of (Sn−1)-th column to (Sn+1)-th column, here) are arranged along the perpendicular direction (column direction). An edge portion of the single crystal semiconductor film 124 is connected to the signal line 173 and a channel formation region is formed in a region where the scanning line 171 overlaps with the single crystal semiconductor film 124 with an insulating film interposed therebetween. Here, the case where a thin film transistor (TFT) with a double gate structure is used as the switching element is illustrated; however, the present invention is not limited thereto.

The other edge portion of the single crystal semiconductor film 124 is connected to a wiring 174 (a source or drain wiring). Part of the wiring 174, which overlaps with the capacitor line 172, has a large pattern to form a capacitor with the capacitor line 172 and the insulating film interposed therebetween. Note that the wiring 174 can also function as an electrode (a source and drain electrode).

In general, a capacitor is formed using the scanning line 171 and the single crystal semiconductor film. However, when the single crystal semiconductor has a polarity (p-type or n-type), a difference occurs in a capacitance due to the polarity of signals supplied to the capacitor. On the other hand, in this embodiment, the capacitor line 172 is formed from a metal, whereby electrodes in the capacitor can be comprised by conductors. Therefore, the difference in a capacitance due to the polarity of data signals supplied from the signal line 173 can be suppressed.

In the capacitor, the insulating film is provided in an upper portion of the wiring 174, and a pixel electrode 175 and the wiring 174 are electrically connected to each other through a contact hole formed in the insulating film. Further, in FIG. 7, a light transmitting portion 176 is provided in the pixel electrode 175 and a region other than the light transmitting portion 176 is shielded by a light blocking film on a counter substrate side.

In addition, in FIG. 7, a space is provided between the capacitor line 172 and the light transmitting portion 176. This space is formed to adjust the size of the light-transmitting portion to be same as that of the light transmitting portion in the different pixel provided with a plurality of thin film transistors. Note that the space can be designed as appropriate depending on a layout with the different pixel.

Since the pixel illustrated in FIG. 7 is formed in the first region 131, the switching element is provided in a pixel region corresponding to the switching element. Here, the case is illustrated, in which the switching element is formed in the periphery of the pixel electrode of the pixel corresponding to the switching element; however, a structure in which the switching element is formed below the pixel electrode can be also employed.

Figure 8:
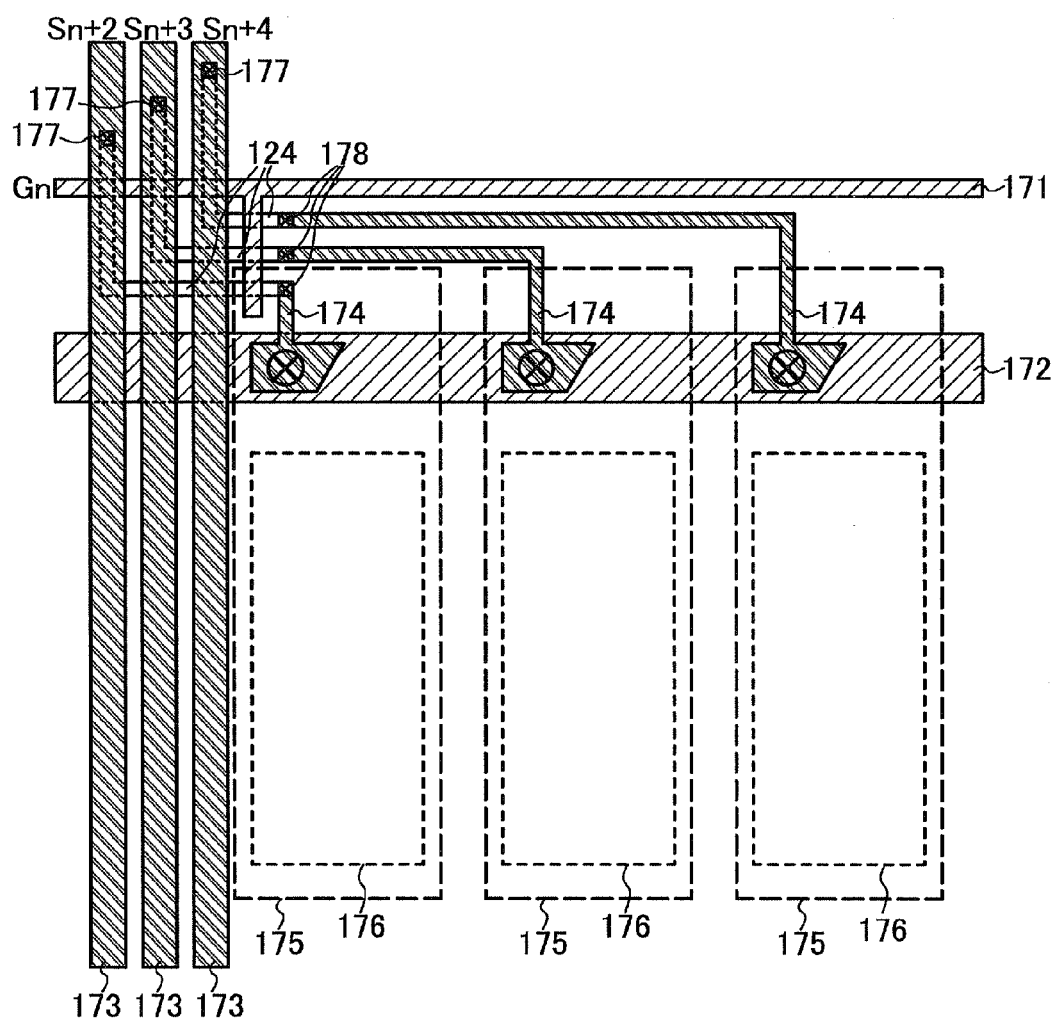
FIG. 8 illustrates an example of a pixel structure of a display device according to the present invention.

FIG. 8 illustrates one structural example of the pixel, in which the single crystal semiconductor film included in the switching element corresponding to the pixel is formed in the region of the different pixel (the structure illustrated in FIG. 3). For example, the pixel corresponds to the pixels of Sn+2-column to Sn+4-column in FIG. 3.

In the pixel illustrated in FIG. 8, the scanning line 171 (which is the scanning line of Gn-th row, here) is arranged in the row direction and the signal lines 173 (which are signal lines of (Sn+2)-th column to (Sn+4)-th column, here) are arranged in the column direction. An edge portion of the single crystal semiconductor film 124 is connected to the signal line 173 and the channel formation region is formed in a region where the single crystal semiconductor film 124 overlaps with the scanning line 171 with the insulating film interposed therebetween. The other edge portion of the single crystal semiconductor film 124 is connected to the wiring 174 (the source and drain wiring). Part of the wiring 174, which overlaps with the capacitor line 172, has a large pattern to form the capacitor with the capacitor line 172 and the insulating film interposed therebetween.

In the pixel illustrated in FIG. 8, since the pixel of (Sn+2)-th column is formed in the first region 131 and the pixels of (Sn+3)-th column and (Sn+4)-th column are formed in the second region 132, the switching elements each corresponding to the pixels of (Sn+2)-th column to (Sn+4)-th column are formed in the pixel region of (Sn+2)-th column. Note that FIG. 8 illustrates the case where the single crystal semiconductor film (the single crystal semiconductor film which is to become the channel formation region) included in the switching element corresponding to the pixel of Sn+2-column is formed below the pixel electrode 175 of the pixel of (Sn+2)-th column and the single crystal semiconductor films included in the switching elements each corresponding to the pixel of (Sn+3)-th column and the pixel of (Sn+4)-th column are formed in the periphery of the pixel electrode 175; however, the present invention is not limited to the case. All of the single crystal semiconductor films included in the switching elements corresponding to the pixels of (Sn+2)-th column to (Sn+4)-th column may be formed below or the periphery of the pixel electrode 175 of the pixel of (Sn+2)-th column or any of the single crystal semiconductor films included in the switching elements corresponding to the pixels of (Sn+2)-th column to (Sn+4)-th column may be selectively formed below or in the periphery of the pixel electrode 175 of the pixel of (Sn+2)-th column.

Further, the switching elements (thin film transistors) corresponding to each of the plurality of pixels are provided collectively and the plurality of the signal lines 173 is arranged to be adjacent to each other without the thin film transistor interposed therebetween. The signal lines 173 are arranged to be adjacent to each other, whereby a distance between the signal line and the switching element is shortened and delay of signals can be reduced.

Further, position for connecting the single crystal semiconductor film 124 and the signal line 173 is preferably adjusted so that distances from a connection portion 177 of an edge portion (a source or drain) of the single crystal semiconductor film 124 and the signal line 173 to the channel formation region of the thin film transistor are the same in the plurality of thin film transistors. The distances from the connection portion 177 of the edge portion (the source or drain) of the single crystal semiconductor film 124 and the signal line 173 to the channel formation region of the thin film transistor are the same in the plurality of thin film transistors, whereby a difference in wiring resistance is eliminated and display defects due to delay of signals can be reduced.

Further, when distances each of which is the distance of a connection portion of the pixel electrode 175 and the wiring 174 to a connection portion 178 of the other edge portion (the source or drain) of the single crystal semiconductor film 124 and the wiring 174 are different from each other in the plurality of thin film transistors, resistance value of each of the wirings 174 is preferably changed. Specifically, the wiring with the longest distance from the connection portion 178 of the wiring 174 and the other edge portion of the single crystal semiconductor film 124 to the connection portion of the pixel electrode 175 and the wiring 174 is formed to have smaller resistance value than the other wirings. Note that resistance value of the wiring refers to a resistance value per unit length.

Figure 9:
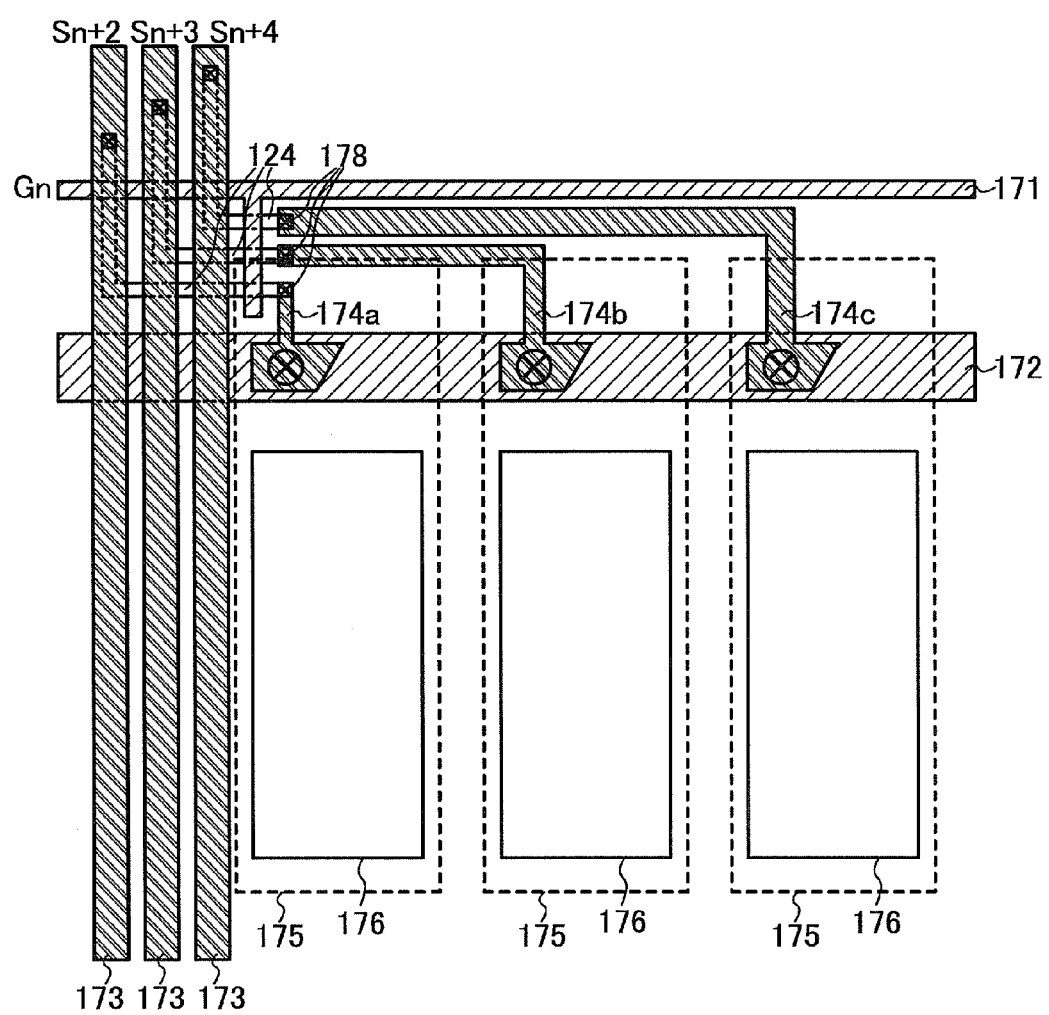
FIG. 9 illustrates an example of a pixel structure of a display device according to the present invention.

For example, as illustrated in FIG. 9, the cross sectional area of the longest wiring (a wiring 174c connected to the pixel electrode of the pixel (which is the pixel of (Sn+4)-th column in FIG. 9) which is the farthest from the signal line 173) is set to be larger than each of the cross sectional areas of the other wirings 174a and 174b. Here, the width of the wiring 174c is set to be larger than those of the other wirings 174a and 174b. Similarly, the cross sectional area (which is the width of the wiring, here) of the wiring 174b connecting to the pixel electrode of the pixel (which is the pixel of (Sn+3)-th column in FIG. 9) is set to be larger than that of the wiring 174a.

In this manner, the resistance value of the wiring is adjusted in accordance with the distance from the connection portion 178 of the wiring 174 and the other edge portion of the single crystal semiconductor film 124 to the connection portion of the pixel electrode 175 and the wiring 174, whereby generation of display defects due to misalignment of delay of signals per wiring can be suppressed.

In addition, as a means for reducing the resistance value of the wiring so as to be smaller than those of the other wirings, each of different materials is used for respective wirings. As a material for the wiring, an element selected from copper (Cu), aluminum (Al), titanium (Ti), tantalum (Ta), tantalum nitride, tungsten (W), molybdenum (Mo), or the like, or an alloy material or compound material containing the element as its main component is used. Specifically, with use of copper (Cu), which has lower resistance value, delay of signal due to resistance of the wiring can be suppressed.

Figure 10:
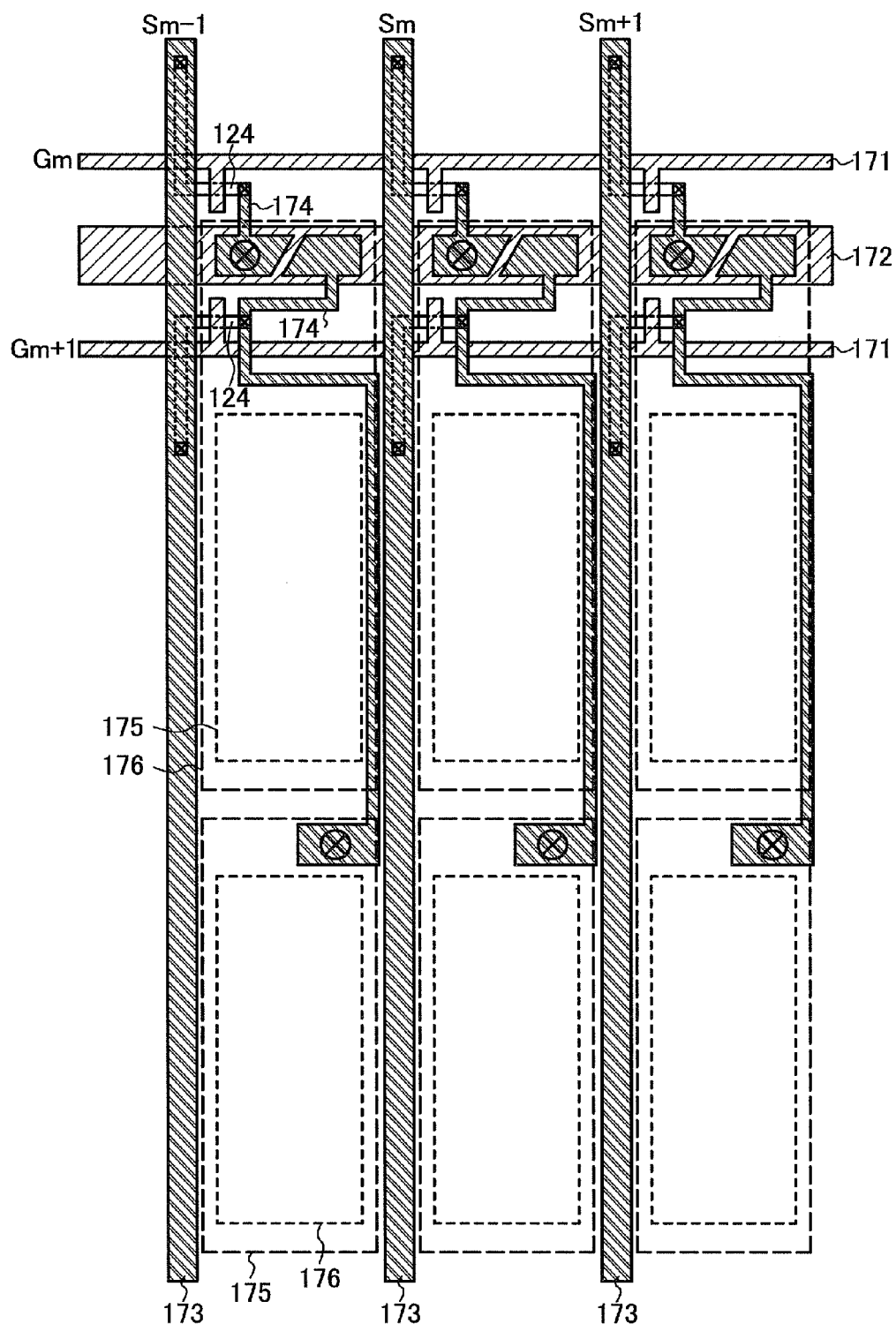
FIG. 10 illustrates an example of a pixel structure of a display device according to the present invention.

FIG. 10 illustrates one structural example of a pixel, in which the single crystal semiconductor film included in the switching element corresponding to the pixel is formed in the region of the different (the structure illustrated in FIG. 5). For example, the pixel corresponds to the pixels of Gm-row to Gm+1-row in FIG. 5.

In the pixels illustrated in FIG. 10, the scanning lines 171 (which are the scanning lines of Gm-th row to (Gm+1)-th row, here) and the capacitor line 172 are arranged in the row direction and the signal lines 173 (which are signal lines of (Sm−1)-th column to (Sm+1)-th column, here) are arranged in the column direction. Note that the capacitor line 172 is arranged between the scanning line 171 of Gm-th row and the scanning line 171 of (Gm+1)-th row and can be used commonly for the pixel of Gm-th row and the pixel of (Gm+1)-th row.

One edge portion of the single crystal semiconductor film 124 is connected to the signal line 173 to form the channel formation region in a region where the single crystal semiconductor film 124 overlaps with the scanning line 171 with the insulating film interposed therebetween. The other edge portion of the single crystal semiconductor film 124 is connected to the wiring 174 (the source and drain wiring). Part of the wiring 174, which overlaps with the capacitor line 172, has a large pattern to form a capacitor with the capacitor line 172 and the insulating film interposed therebetween.

In the capacitor of the pixel of Gm-row, the insulating film is provided in an upper portion of the wiring 174 and the pixel electrode 175 and the wiring 174 are electrically connected to each other through the contact hole formed in the insulating film. On the other hand, in the pixel of Gm+1-row, the wiring 174 is led to be electrically connected to the pixel electrode 175.

In the case of the pixels illustrated in FIG. 10, part of the pixels of Gm-th row is formed in the first region 131 and the pixel of (Gm+1)-th row is formed in the second region 132, whereby, in the column direction, switching elements each of which corresponding to the pixel of Gm-th row and the pixel of (Gm+1)-th row are formed in the region of the part of the pixels in Gm-th row. Note that, FIG. 10 illustrates the case where the single crystal semiconductor film (the single crystal semiconductor film which is to become the channel formation region) included in the switching element corresponding to the pixel of Gm-th row is formed in the periphery of the pixel electrode of the pixel of Gm-th row, the single crystal semiconductor film included in the switching element corresponding to the pixel of (Gm+1)-th row is formed below the pixel electrode of the pixel of Gm-th row; however, the present invention is not limited to the case. Both the single crystal semiconductor films included in the switching elements corresponding to the pixel of Gm-th row and the pixel of (Gm+1)-th row may be formed below or in the periphery of the pixel electrode of the pixel of Gm-th row, or any of the single crystal semiconductor films included in the switching elements corresponding to the pixel of Gm-th row and the pixel of (Gm+1)-th row may be selectively formed below or in the periphery of the pixel electrode of the pixel of Gm-th row.

Figure 11:
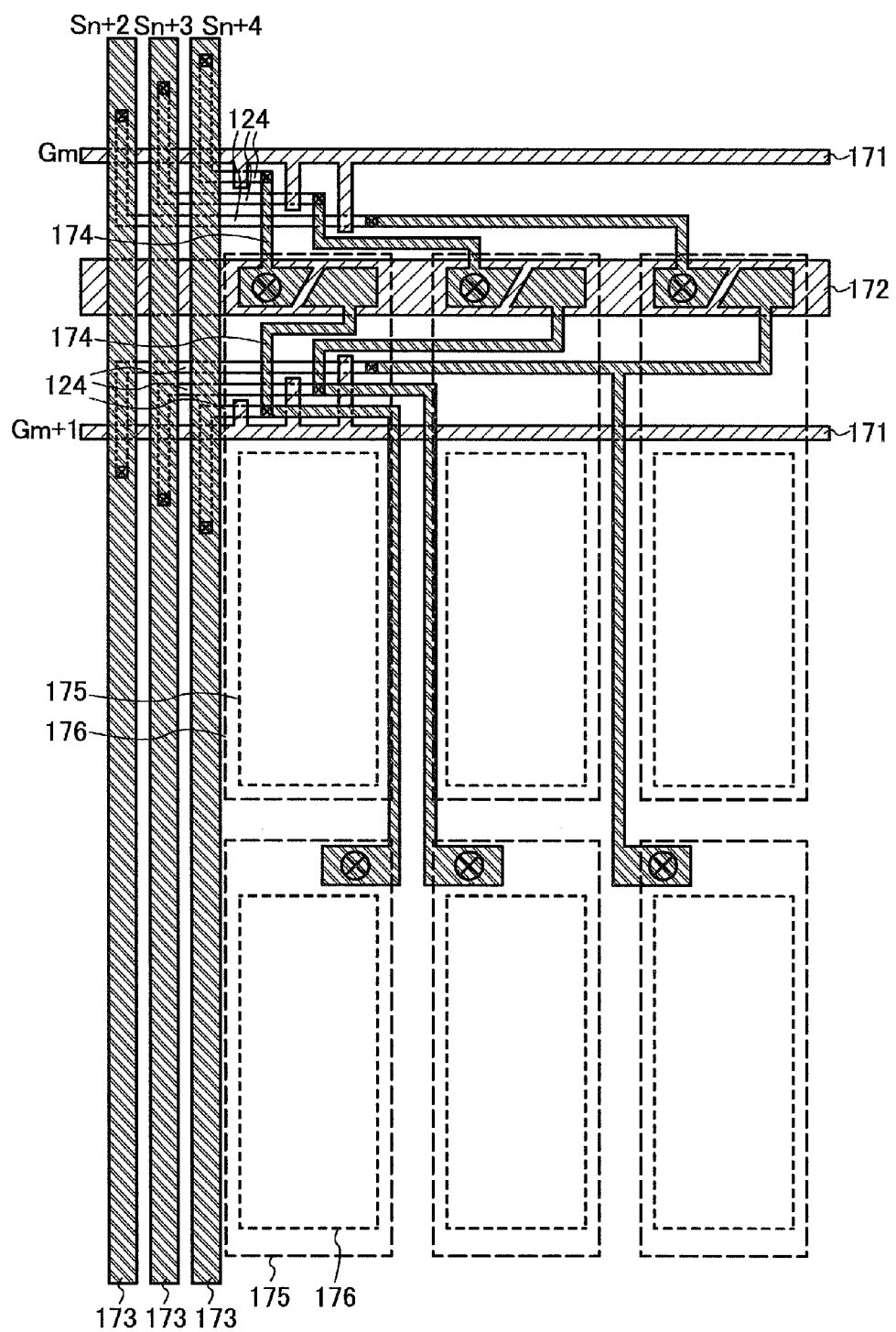
FIG. 11 illustrates an example of a pixel structure of a display device according to the present invention.

FIG. 11 illustrates one structural example of the pixel, in which the single crystal semiconductor film included in the switching element corresponding to the pixel is formed in the region of the different (the structure illustrated in FIG. 6). For example, the pixel corresponds to the pixel of FIG. 6, to which data signals are supplied by the signal lines of (Sn+2)-th column to (Sn+4)-th column and whose drive is controlled by the scanning lines of Gm-th row to (Gm+1)-th row.

In the pixel illustrated in FIG. 11, the scanning lines 171 (which are the scanning lines of Gm-th row to (Gm+1)-th row, here) and the capacitor line 172 are arranged in the row direction and the signal lines 173 (which are the signal lines of (Sn+2)-th column to (Sn+4)-th column, here) are arranged in the column direction. Note that the capacitor line 172 is arranged between the scanning line 171 of Gm-th row and the scanning line 171 of (Gm+1)-th row and can be used commonly for the pixel of Gm-row and the pixel of (Gm+1)-th row. The structure of the pixel in FIG. 11 can be framed by combination of the structures illustrated in FIG. 8 and FIG. 10.

As described in this embodiment, even when the junction portion is generated between the plurality of single crystal semiconductor films provided over the base substrate by bonding, the switching element corresponding to the pixel provided in the second region 132, so that the pixel can be provided over the joint portion. As a result, even when the single crystal semiconductor film is used as the element included in the pixel, reduction in the size of the pixel and high definition can be achieved while enlargement of the display portion can be realized. Further, even when the switching element corresponding to the pixel is formed in the region of the different pixel, by changing the resistance value of the wiring, delay of signals due to leading of the wiring can be reduced and display defects can be suppressed.

[Embodiment 2]

Figure 12A:
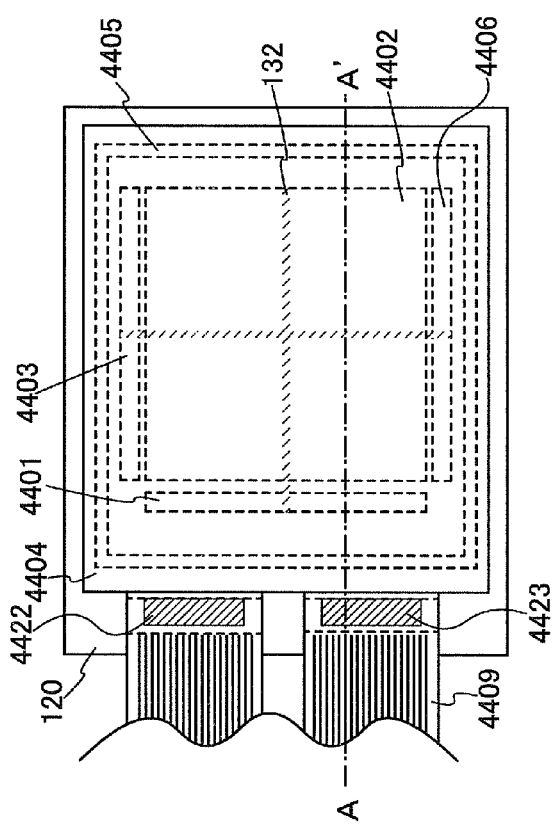
FIGS. 12A and 12B illustrate an example of a display device according to the present invention.
Figure 12B:
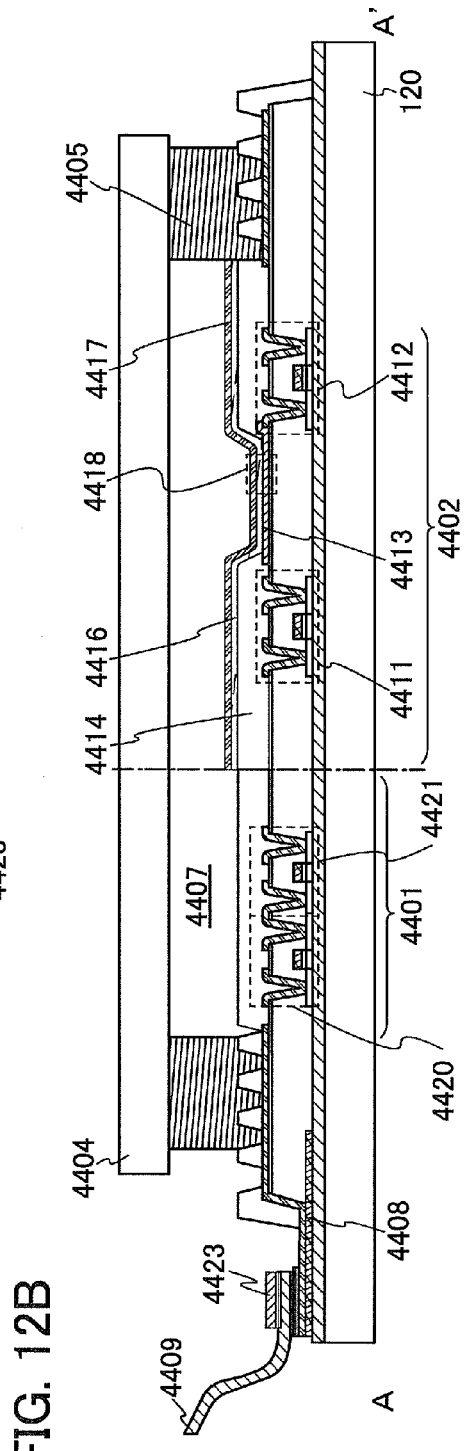

In this embodiment, a display panel manufactured by using the SOI substrate described in Embodiment 1 is described with reference to FIGS. 12A and 12B. Note that FIG. 12A is a top view of the display panel, and FIG. 12B is a sectional view taken along the line A-A' of FIG. 12A. A signal line driver circuit 4401, a display portion 4402, a first scanning line driver circuit 4403, and a second scanning line driver circuit 4406, which are indicated by dotted lines, are included. A sealing substrate 4404 and a sealing material 4405 are also included, and a space surrounded by the sealing material 4405 is a space 4407.

A wiring 4408 is a wiring to transmit signals input to the first scanning line driver circuit 4403, the second scanning line driver circuit 4406, and the signal line driver circuit 4401, and receives video signals, clock signals, start signals, and the like from an FPC 4409 that become an external input terminal. An IC chip (a semiconductor chip in which a memory circuit, a buffer circuit, and the like are formed) 4422 and 4423 are mounted over a junction portion of the FPC 4409 and the display panel by COG (chip on glass) or the like. Note that, although only the FPC is illustrated here, a printed wiring board (PWB) may be attached to this FPC. Instead of including a semiconductor chip in the memory circuit, the buffer circuit, and the like, a transistor using a single crystal semiconductor film formed over a substrate may be included in the memory circuit, the buffer circuit, and the like.

Next, the sectional structure will be described with reference to FIG. 12B. The display portion 4402 and peripheral driver circuits (the first scanning line driver circuit 4403, the second scanning line driver circuit 4406, and the signal line driver circuit 4401) are formed over a substrate 120. Here, the signal line driver circuit 4401 and the display portion 4402 are illustrated.

Note that the signal line driver circuit 4401 includes a large number of transistors such as transistors 4420 and 4421.

In addition, the display portion 4402 is provided with a plurality of circuits including a switching transistor 4411 (a first transistor) and a driving transistor 4412 (a second transistor). Note that, as described above, a transistor corresponding to a pixel formed in a region (a second region 132) where the single crystal semiconductor film is not formed by a bonding is formed in the region of the different pixel in the display portion 4402. Note that a source electrode of the driving transistor 4412 is connected to a pixel electrode 4413. An insulator 4414 is formed to cover an edge portion of the pixel electrode 4413. Here, a positive photosensitive acrylic resin film is used to form the insulator 4414. Note that the single crystal semiconductor films included in transistors 4411 and 4412 are used as channel formation regions.

A layer 4416 containing an organic compound and a counter electrode 4417 are formed over the pixel electrode 4413. Here, as a material for the pixel electrode 4413 which functions as an anode, a material with a high work function is preferably used. For example, a single layer film such as an ITO (indium tin oxide) film, an indium zinc oxide (IZO) film, a titanium nitride film, a chromium film, a tungsten film, a Zn film, and a Pt film; a stacked layer of a titanium nitride film and a film mainly containing aluminum; a three-layer structure of a titanium nitride film, a film mainly containing aluminum, and a titanium nitride film, and the like can be used. Furthermore, when the pixel electrode 4413 is formed using a laminated layer, the resistance can be reduced as a wiring and a good ohmic contact can be obtained, whereby the pixel electrode 4413 can function as the anode.

The layer 4416 containing the organic compound is formed by a vapor deposition method using a vapor deposition mask or by an ink-jet method. A metal complex using a metal from group 4 of the periodic table is used for a part of the layer 4416 containing the organic compound, and a low molecular material or a high molecular material may be used in combination. In addition, as a material used for the layer containing an organic compound, there are usually many cases where an organic compound is used as a single layer or a stacked layer. However, this embodiment includes a structure in which a film including an organic compound partially includes an inorganic compound. Moreover, a triplet material can also be used.

Further, as a material used for the counter electrode 4417, which is a cathode, formed over the layer 4416 containing the organic compound, a material with a low work function (Al, Ag, Li, Ca, or an alloy thereof such as MgAg, MgIn, AlLi, $CaF_2$, or calcium nitride) may be used. Note that when light generated in the layer 4416 containing the organic compound is transmitted through the second electrode 4417, a stacked layer of a thin metal film and a transparent conductive layer (ITO (indium tin oxide), an indium oxide-zinc oxide alloy ($In_2O_3$—ZnO), zinc oxide, or the like) is preferably used as the second electrode 4417.

In addition, the sealing substrate 4404 is bonded to the substrate 100 with the sealing material 4405 to have a structure provided with a light-emitting element 4418 in the space 4407 surrounded by the substrate 100, the sealing substrate 4404, and the sealing material 4405. Note that the space 4407 may be filled with the sealing material 4405 or with a rare gas (such as nitrogen or argon).

Note that an epoxy-based resin is preferably used for the sealing material 4405. In addition, it is desirable to use a material that allows permeation of moisture or oxygen as little as possible. In addition, as a material used for the sealing substrate 4404, a plastic substrate formed using FRP (fiber-glass-reinforced plastics), PVF (polyvinyl fluoride), polyester, acrylic, or the like as well as a glass substrate or a quartz substrate can be used.

As described above, a display panel using the SOI substrate described in Embodiment 1 can be obtained.

As illustrated in FIGS. 12A and 12B, the signal line driver circuit 4401, the display portion 4402, the first scanning line driver circuit 4403, and the second scanning line driver circuit 4406 are formed over the substrate 120, whereby reduction in cost of the display device can be realized. Note that when unipolar transistors are used for the signal line driver circuit 4401, the display portion 4402, the first scanning line driver circuit 4403, and the second scanning line driver circuit 4406, simplification of a manufacturing process can be realized, and thereby, further cost reduction can be realized. When single crystal semiconductor layers are used for semiconductor layers of transistors used for the signal line driver circuit 4401, the display portion 4402, the first scanning line driver circuit 4403, and the second scanning line driver circuit 4406, reduction in the size of the display device and high speed operation thereof can be realized.

Note that, in this embodiment, the EL display device is exemplified as a display panel manufactured using an SOI substrate, the SOI substrate can also be applied to a liquid crystal display device.

[Embodiment 3]

In this embodiment, an electronic device in which the aforementioned display device is used will be described with reference to FIGS. 13A to 13H and FIGS. 14A to 14C.

In this embodiment, the following can be exemplified as electric devices: a camera such as a video camera or a digital camera, a goggle type display (a head mounted display), a navigation system, an audio reproducing device (car audio set, audio component set, or the like), a computer, a game machine, a portable information terminal (mobile computer, mobile phone, portable game machine, electronic book, or the like), and an image reproducing device provided with a recording medium (specifically, a device provided with a display device that can reproduce a recording medium such as a digital versatile disc (DVD) and display the image), and the like.

Figure 13A:
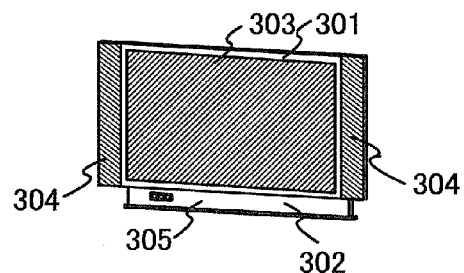
FIGS. 13A to 13H each illustrate an electronic appliance in which a display device of the present invention is used.

FIG. 13A illustrates a television set or a monitor of a personal computer. The television set or the monitor of the personal computer in FIG. 13A includes a housing 301, a supporting base 302, a display portion 303, a speaker portion 304, a video inputting terminal 305, and the like. By forming the display portion 303 with a transistor formed using a single crystal semiconductor, the television set or the monitor of the personal computer with high reliability and high performance can be provided.

Figure 13B:
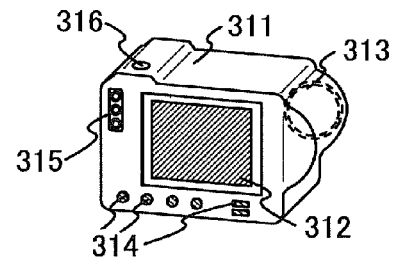

FIG. 13B illustrates a digital camera. An image receiving portion 313 is provided in the front side of a main body 311. A shutter button 316 is provided at the upper portion of the main body 311. A display portion 312, operation keys 314, and an external connection port 315 are provided at the back-side of the main body 311. By forming the display portion 312 with a transistor formed using a single crystal semiconductor, the digital camera with high reliability and high performance can be provided.

Figure 13C:
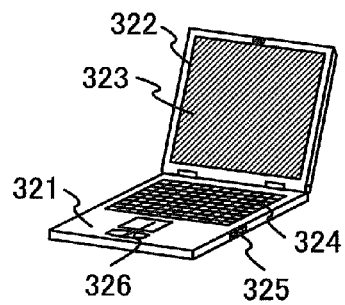

FIG. 13C illustrates a laptop personal computer. A main body 321 is provided with a keyboard 324, an external connection port 325, and a pointing device 326. Moreover, the main body 321 is provided with a housing 322 including a display portion 323. By forming the display portion 323 with a transistor formed using a single crystal semiconductor, the laptop personal computer with high reliability and high performance can be provided.

Figure 13D:
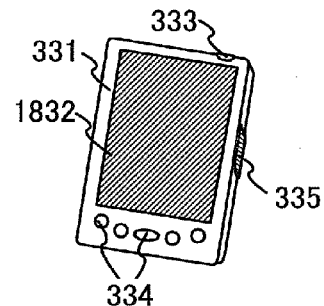

FIG. 13D is a mobile computer, which includes a main body 331, a display portion 332, a switch 333, operating keys 334, an infrared port 335, and the like. An active matrix display device is provided in the display portion 332. By forming the display portion 332 with a transistor formed using a single crystal semiconductor, the mobile computer with high reliability and high performance can be provided.

Figure 13E:
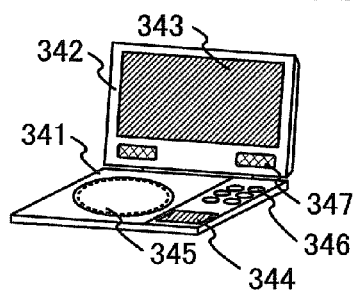

FIG. 13E illustrates an image reproducing device. A main body 341 is provided with a display portion (B) 344, a recording medium reader 345, and operation keys 346. Moreover, the main body 341 is provided with a housing 342 including a speaker portion 347 and a display portion (A) 343. By forming each of the display portions (A) 343 and (B) 344 with a transistor formed using a single crystal semiconductor, the image reproducing device with high reliability and high performance can be provided.

Figure 13F:
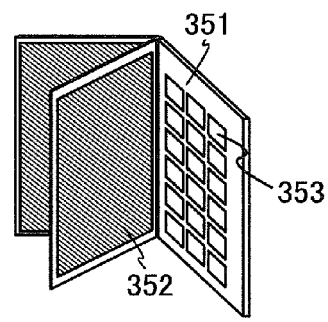

FIG. 13F illustrates an electronic book. A main body 351 is provided with operation keys 353. A plurality of display portions 352 is attached to the main body 351. By forming the display portion 352 with a transistor formed using a single crystal semiconductor, the electronic book with high reliability and high performance can be provided.

Figure 13G:
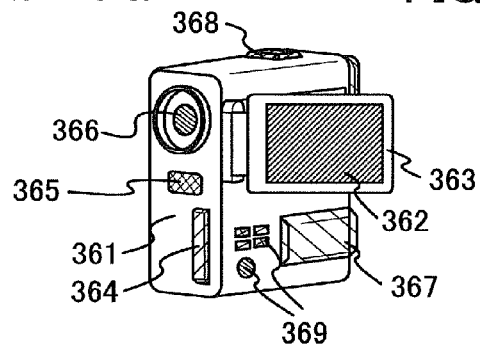

FIG. 13G illustrates a video camera. A main body 361 is provided with an external connection port 364, a remote controller receiving portion 365, an image receiving portion 366, a battery 367, an audio input portion 368, and operation keys 369.

Moreover, a housing 363 including a display portion 362 is attached to the main body 361. By forming the display portion 362 with a transistor formed using a single crystal semiconductor, the video camera with high reliability and high performance can be provided.

Figure 13H:
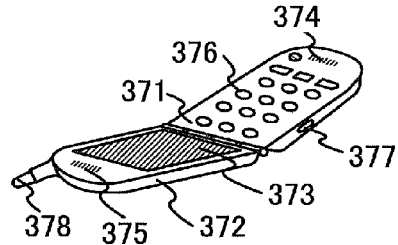

FIG. 13H illustrates a mobile phone, which includes a main body 371, a housing 372, a display portion 373, an audio input portion 374, an audio output portion 375, operation keys 376, an external connection port 377, an antenna 378, and the like. By forming the display portion 373 with a transistor formed using a single crystal semiconductor, the mobile phone with high reliability and high performance can be provided.

Figure 14A:
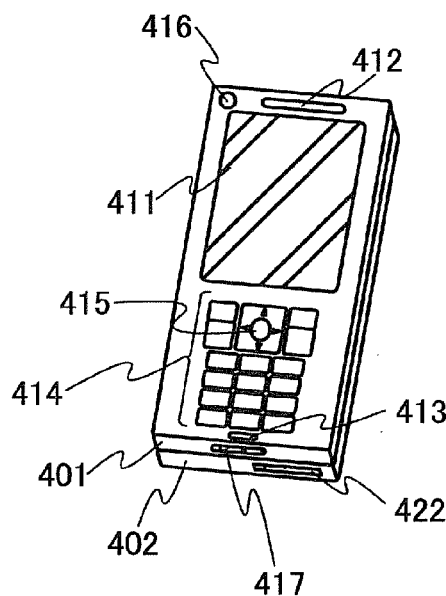
FIGS. 14A to 14C each illustrate an electronic appliance in which a display device of the present invention is used.
Figure 14B:
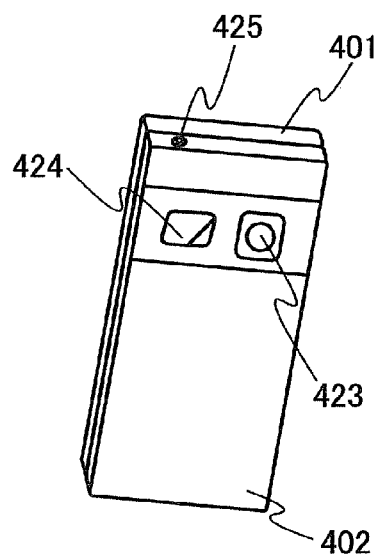
Figure 14C:
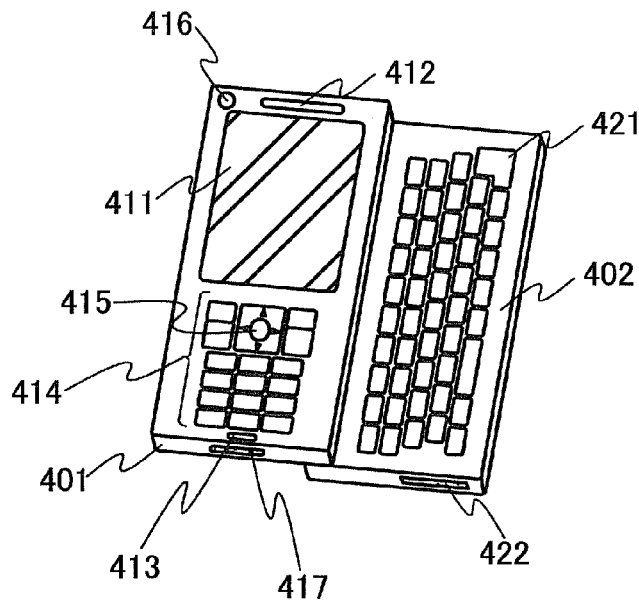

FIGS. 14A to 14C illustrate an example of a structure of a portable electronic device 400 having functions as a telephone and an information terminal. FIG. 14A is a front view, FIG. 14B is a back view, and FIG. 14C is a developed view. The portable electronic device 400 has functions as both a telephone and an information terminal and is an electronic device so-called a smartphone which is capable of various data processing in addition to voice call.

The portable electronic device 400 includes housings 401 and 402. The housing 401 is provided with a display portion 411, a speaker 412, a microphone 413, operation keys 414, a pointing device 415, a lens 416 for camera, an external connection terminal 417, and the like. The housing 402 is provided with a keyboard 421, an external memory slot 422, a lens 423 for camera, a light 424, an earphone terminal 425, and the like. Moreover, an antenna is built into the housing 401. In addition to the aforementioned structure, a noncontact IC ship, a small size memory device, or the like may be built therein.

The display portion 411 includes a transistor formed using a single crystal semiconductor. An image displayed (and direction in which the image is displayed) in the display portion 411 variously changes in accordance with the usage pattern of the portable electronic device 400. Moreover, since the display portion 411 and the lens 416 for camera are provided on the same surface, voice call (so-called videophone) with images can be possible. Note that the speaker 412 and the microphone 413 can be used not only for voice call but also for recording, reproducing, or the like. In the case where a still image and a moving image are shot by using the lens 423 for camera (and the light 424), the display portion 411 is used as a finder. The operation keys 414 are used for incoming/outgoing of phone call, inputting simple information such as e-mail, screen scrolling, moving cursor, and the like.

The housings 401 and 402 overlapping with each other (FIG. 14A) slide and can be developed as illustrated in FIG. 14C, so that the portable electronic device 400 can be used as an information terminal. In this case, smooth operation with the keyboard 421 and the pointing device 415 can be performed. The external connection terminal 417 can be connected to various cables such as an AC adopter or a USB cable, whereby the portable electronic device 400 can be charged or can perform data communication with a computer or the like. Moreover, by inserting a recording medium into the external memory slot 422, the portable electronic device 400 can deal with storing and moving data with higher capacitance. In addition to the aforementioned functions, a function of wireless communication by using electromagnetic waves such as infrared rays, a function of receiving television, and the like can be included.

This application is based on Japanese Patent Application serial no. 2008-085409 filed with Japan Patent Office on Mar. 28, 2008, the entire contents of which are hereby incorporated by reference.

What is claimed is:

1. A semiconductor device comprising:
a pixel portion provided with a plurality of pixels, the pixel portion comprising a plurality of semiconductor films over a substrate; and
switching elements each of which is provided so as to correspond to each of the plurality of pixels and each of which is provided with one of the semiconductor films,
wherein a first pixel is provided in a junction portion between the semiconductor films and a second pixel is provided over one of the semiconductor films, and
wherein a first switching element corresponding to the first pixel is provided in a region of the second pixel.

2. The semiconductor device according to claim 1, wherein each of the plurality of pixels includes a pixel electrode, and
wherein a first semiconductor film included in the first switching element corresponding to the first pixel and a second semiconductor film included in a second switching element corresponding to the second pixel are provided in the second pixel.

3. The semiconductor device according to claim 2, wherein the first semiconductor film and the second semiconductor film are provided on a first insulating film and a second insulating film, respectively.

4. The semiconductor device according to claim 2, wherein the first switching element corresponding to the first pixel and a first pixel electrode provided in the first pixel are electrically connected to each other via a first wiring,
wherein the second switching element corresponding to the second pixel and a second pixel electrode provided in the second pixel are electrically connected to each other via a second wiring, and
wherein the first wiring is longer than the second wiring and a resistance value of the first wiring is smaller than a resistance value of the second wiring.

5. The semiconductor device according to claim 1, wherein each of the switching elements is a transistor comprising one of the semiconductor films used as a channel formation region.

6. The semiconductor device according to claim 1, wherein each of the plurality of semiconductor films comprises a single crystal semiconductor film.

7. A semiconductor device comprising:
a substrate having a first portion and a second portion, wherein the first portion is a junction portion between a plurality of semiconductor films and the second portion comprises one of the semiconductor films;
a pixel portion having first pixels on the first portion and second pixels on the second portion over the substrate; and
a plurality of first switching elements and a plurality of second switching elements in the second pixels, the first switching elements electrically connected with first pixel electrodes of the first pixels on the first portion and the second switching elements electrically connected with second pixel electrodes of the second pixels on the second portion,
wherein the first switching elements and the second switching elements comprise the semiconductor films in the second portion.

8. The semiconductor device according to claim 7, wherein the first switching elements are provided in a periphery of the second pixel electrodes of the second pixels on the second portion.

9. The semiconductor device according to claim 7, wherein each of the semiconductor films is provided on an insulating film on the substrate.

10. The semiconductor device according to claim 7, wherein the first switching elements and the first pixel electrodes are electrically connected to each other via first wirings,
wherein the second switching elements and the second pixel electrodes are electrically connected to each other via second wirings, and
wherein each of the first wirings is longer than each of the second wirings and a resistance value of each of the first wirings is smaller than a resistance value of each of the second wirings.

11. The semiconductor device according to claim 10, wherein a cross sectional area of each of the first wirings is larger than that of each of the second wirings.

12. The semiconductor device according to claim 7, wherein the first pixels on the first portion are provided along a row direction and/or a column direction in the pixel portion.

13. The semiconductor device according to claim 7, wherein each of the first switching elements and the second switching elements is a transistor comprising one of the semiconductor films as a channel formation region.

14. The semiconductor device according to claim 7, wherein each of the plurality of semiconductor films comprises a single crystal semiconductor film.

15. A semiconductor device comprising:
a plurality of semiconductor films over a substrate;
a pixel portion provided with a plurality of pixels which include a first pixel and a second pixel, wherein the second pixel is provided over one of the semiconductor films and the first pixel is provided in a junction portion between the semiconductor films;
a first transistor comprising a first semiconductor film which is formed so as to correspond to the first pixel;
a second transistor comprising a second semiconductor film which is formed so as to correspond to the second pixel;
a first pixel electrode in the first pixel, the first pixel electrode electrically connecting to the first transistor; and
a second pixel electrode in the second pixel, the second pixel electrode electrically connecting to the second transistor,
wherein the first semiconductor film and the second semiconductor film are provided in the second pixel.

16. The semiconductor device according to claim 15, wherein the first semiconductor film and the second semiconductor film are provided on a first insulating film and a second insulating film, respectively.

17. The semiconductor device according to claim 15,
wherein a source or a drain of each of the first transistor and the second transistor is electrically connected to a signal line which supplies one of the first pixel and the second pixel with a data signal, and
wherein a distance from a first connection portion between the first transistor and the signal line to a channel formation region of the first transistor is the same as a distance from a second connection portion between the second transistor and the signal line to a channel formation region of the second transistor.

18. The semiconductor device according to claim 15,
wherein the first transistor and the first pixel electrode are electrically connected to each other via a first wiring,
wherein the second transistor and the second pixel electrode are electrically connected to each other via a second wiring, and
wherein the first wiring is longer than the second wiring and a resistance value of the first wiring is smaller than a resistance value of the second wiring.

19. The semiconductor device according to claim 18, wherein a cross sectional area of the first wiring is larger than that of the second wiring.

20. The semiconductor device according to claim 15, wherein each of the plurality of semiconductor films comprises a single crystal semiconductor film.

\* \* \* \* \*